United States Patent
Pantelias et al.

(10) Patent No.: US 10,411,830 B2
(45) Date of Patent: Sep. 10, 2019

(54) CODEWORD BUILDER FOR COMMUNICATION SYSTEMS

(71) Applicant: BROADCOM CORPORATION, Irvine, CA (US)

(72) Inventors: Niki Roberta Pantelias, Duluth, GA (US); Joel I. Danzig, Alpharetta, GA (US); Taruna Tjahjadi, Snellville, GA (US); Christopher John Plachta, San Bruno, CA (US)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 56 days.

(21) Appl. No.: 15/011,605

(22) Filed: Jan. 31, 2016

(65) Prior Publication Data
US 2016/0233980 A1 Aug. 11, 2016

Related U.S. Application Data

(60) Provisional application No. 62/115,103, filed on Feb. 11, 2015, provisional application No. 62/287,389, filed on Jan. 26, 2016.

(51) Int. Cl.
*H04L 1/00* (2006.01)
*H03M 13/29* (2006.01)
(Continued)

(52) U.S. Cl.
CPC .......... *H04L 1/0041* (2013.01); *H03M 13/09* (2013.01); *H03M 13/1102* (2013.01);
(Continued)

(58) Field of Classification Search
CPC . H04L 1/0041; H03M 13/09; H03M 13/1102; H03M 13/2957; H03M 13/152;
(Continued)

(56) References Cited

U.S. PATENT DOCUMENTS

| | | | | |
|---|---|---|---|---|
| 2004/0001493 A1* | 1/2004 | Cloonan | ................. | H04L 47/10 370/395.42 |
| 2005/0281279 A1* | 12/2005 | Dennison | ................ | H04L 47/50 370/412 |
| 2016/0301601 A1* | 10/2016 | Anand | .................... | H04L 47/12 |

OTHER PUBLICATIONS

Cable Television Laboratories, Inc., Data-Over-Cable Service Interface Specifications, DOCSIS® 3.1, MAC and Upper Layer Protocols Interface Specification, CM-SP-MULPIv3.1-I04-141218, 20141218.*

(Continued)

*Primary Examiner* — April Y Blair
*Assistant Examiner* — Rong Tang
(74) *Attorney, Agent, or Firm* — Garlick & Markison; Randy W. Lacasse

(57) ABSTRACT

A communication device (alternatively, device) includes a processor configured to support communications with other communication device(s) and to generate and process signals for such communications. In some examples, the device includes a communication interface and a processor, among other possible circuitries, components, elements, etc. to support communications with other communication device(s) and to generate and process signals for such communications. Such a communication device includes a processor configured to perform codeword builder functionality to generate information that undergoes error checking and correction (ECC) and/or forward error correction (FEC) coding. The processor intelligently selects packets from buffers to generate information blocks that undergo ECC and/or FEC coding and transmission and to meet certain latency constraints in conjunction with a predetermined period of time (e.g., a programmable threshold). Such a communication device may be implemented in a point-to-multipoint communication system that services multiple other communication devices.

18 Claims, 9 Drawing Sheets

(51) Int. Cl.
  *H03M 13/09*   (2006.01)
  *H03M 13/11*   (2006.01)
  *H03M 13/15*   (2006.01)
  *H03M 13/23*   (2006.01)
  *H03M 13/25*   (2006.01)

(52) U.S. Cl.
  CPC ...... *H03M 13/152* (2013.01); *H03M 13/1515* (2013.01); *H03M 13/23* (2013.01); *H03M 13/258* (2013.01); *H03M 13/2906* (2013.01); *H03M 13/2957* (2013.01)

(58) Field of Classification Search
  CPC ............... H03M 13/23; H03M 13/258; H03M 13/1515; H03M 13/2906
  See application file for complete search history.

(56) References Cited

OTHER PUBLICATIONS

Cable Television Laboratories, Inc., Data-Over-Cable Service Interface Specifications, DOCSIS® 3.1, MAC and Upper Layer Protocols Interface Specification, CM-SP-MULPIv3.1-I04-141218, Dec. 18, 2014.*

Cable Television Laboratories, Inc., Data-Over-Cable Service Interface Specifications, DOCSIS® 3.1, MAC and Upper Layer Protocols Interface Specification, CM-SP-MULPIv3.1-I04-141218, Dec. 18, 2014 (Year: 2014).*

* cited by examiner

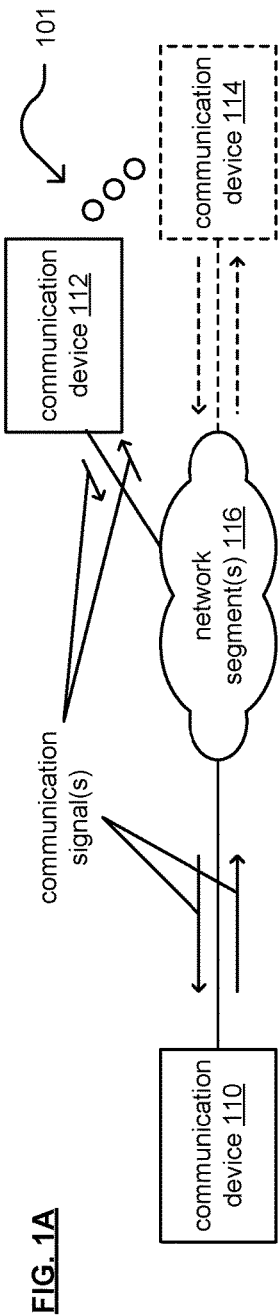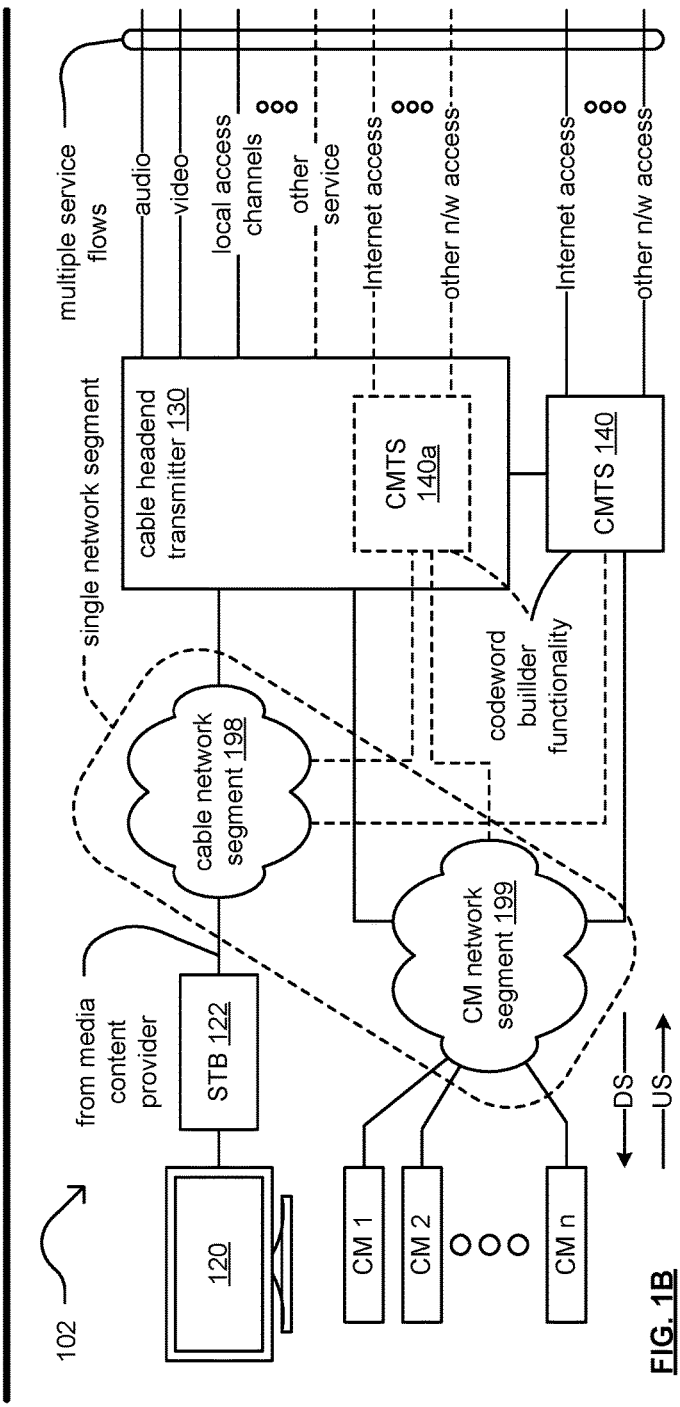

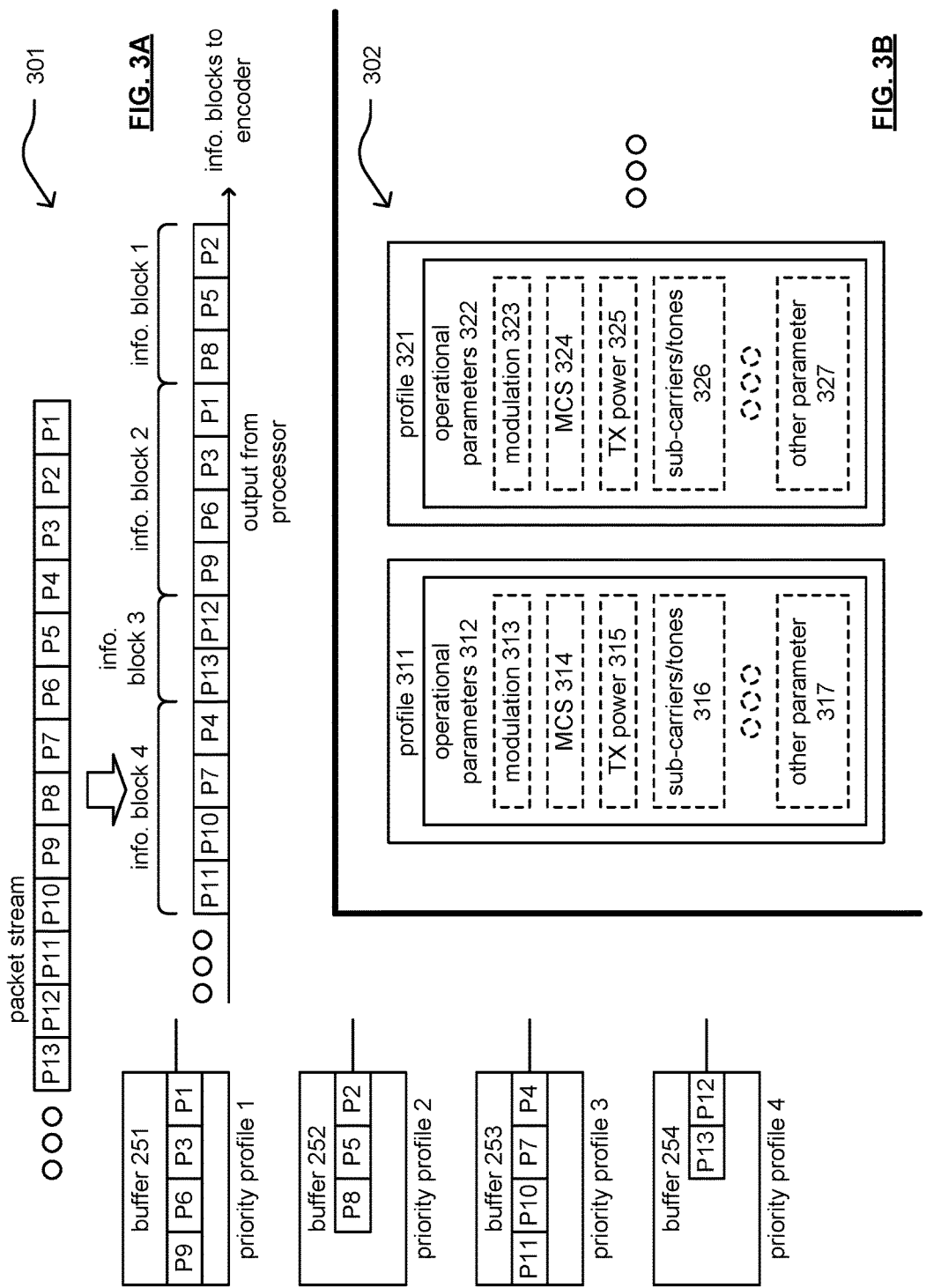

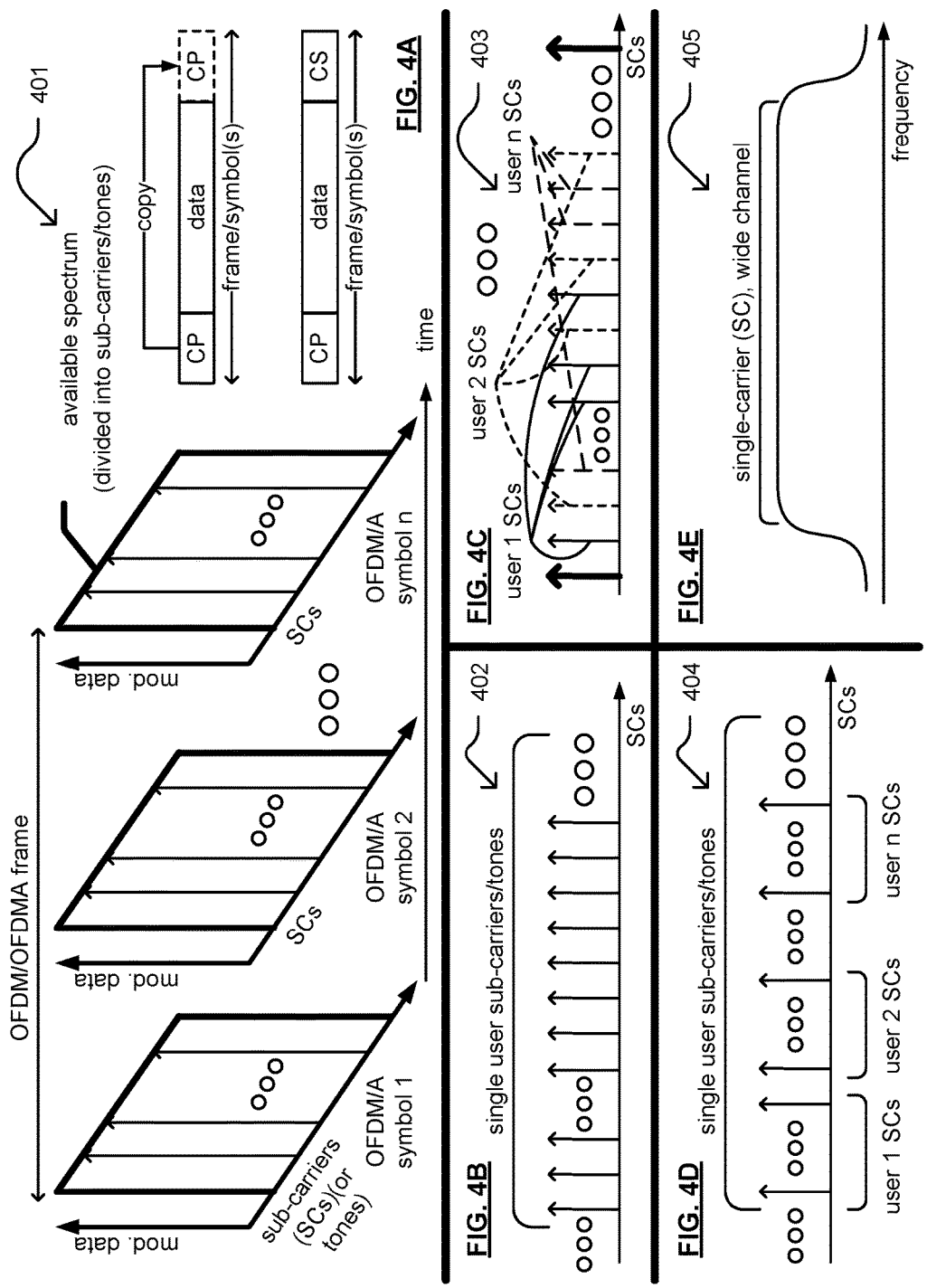

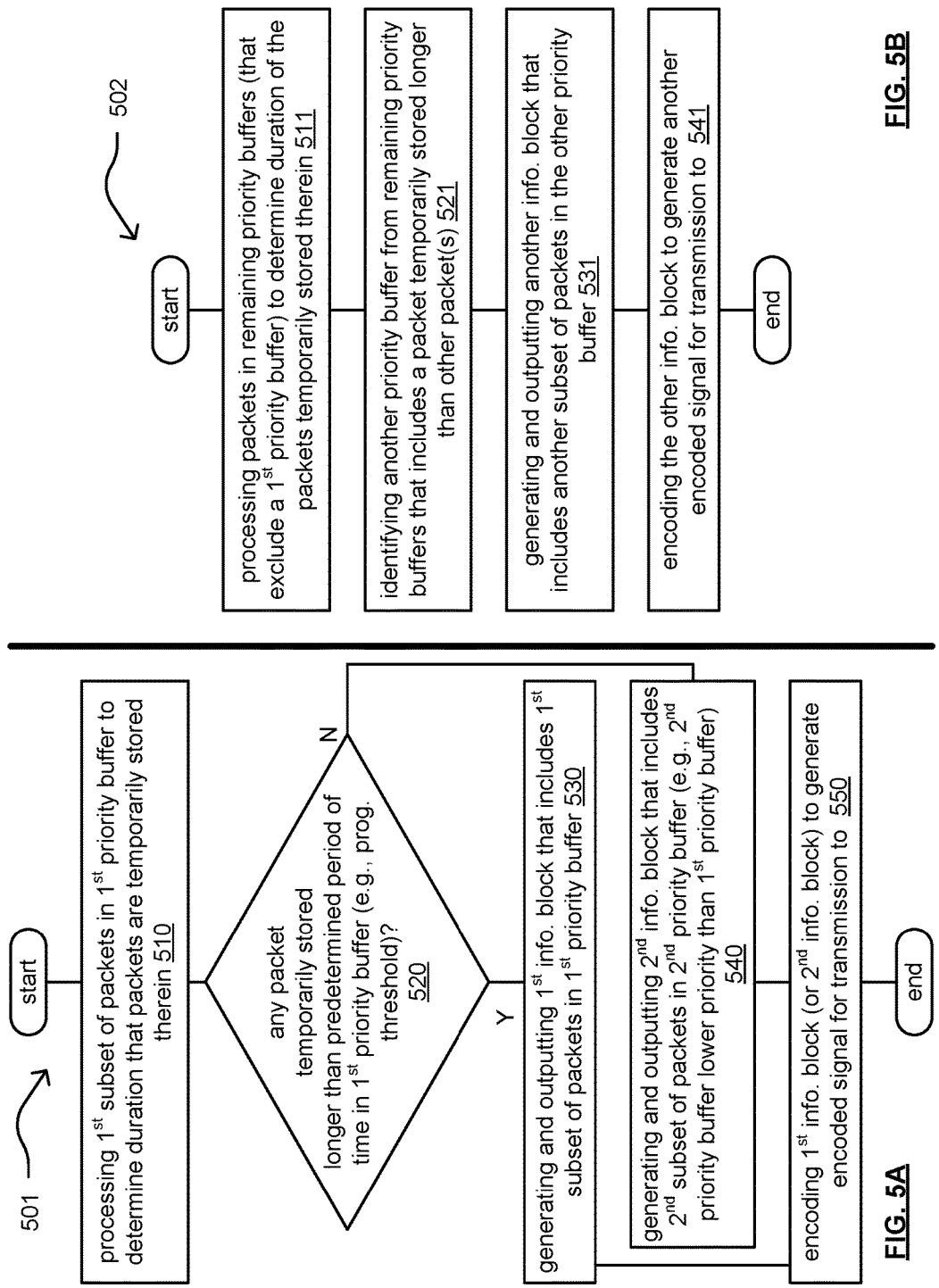

CODEWORD BUILDER FOR COMMUNICATION SYSTEMS

CROSS REFERENCE TO RELATED PATENTS/PATENT APPLICATIONS

Provisional Priority Claims

The present U.S. Utility Patent Application claims priority pursuant to 35 U.S.C. § 119(e) to U.S. Provisional Application No. 62/115,103, entitled "Codeword builder for communication systems," filed Feb. 11, 2015; and U.S. Provisional Application No. 62/287,389, entitled "Codeword builder for communication systems," filed Jan. 26, 2016, both of which are hereby incorporated herein by reference in their entirety and made part of the present U.S. Utility patent application for all purposes.

BACKGROUND

Technical Field

The present disclosure relates generally to communication systems; and, more particularly, to codeword building and generation including information block construction for forward error correction (FEC) and/or error checking and correction (ECC) coding within such communication systems.

Description of Related Art

Data communication systems have been under continual development for many years. The primary goal within such communication systems is to transmit information successfully between devices. Unfortunately, many things can deleteriously affect signals transmitted within such systems resulting in degradation of or even complete failure of communication. Examples of adverse effects include interference and noise that may be caused by various sources including other communications, low-quality links, degraded or corrupted interfaces and connectors, etc.

Some communication systems use forward error correction (FEC) coding and/or error checking and correction (ECC) coding to increase the reliability and the amount of information that may be transmitted between devices. When a signal incurs one or more errors during transmission, a receiver device can employ the FEC or ECC coding to try to correct those one or more errors.

A continual and primary directive in this area of development has been to try continually to lower the signal to noise ratio (SNR) required to achieve a given bit error ratio (BER) or symbol error ratio (SER) within a communication system. The Shannon limit is the theoretical bound for channel capacity for a given modulation and code rate. The ideal goal has been to try to reach Shannon's channel capacity limit in a communication channel. Shannon's limit may be viewed as being the maximum data rate per unit of bandwidth (i.e., spectral efficiency) to be used in a communication channel, having a particular SNR, where transmission through the communication channel with arbitrarily low BER or SER is achievable.

The prior art does not provide adequate means by which high levels of performance and throughput may be met while servicing communication traffic having different characteristics including different service flows that may have different priorities. There continues to be room for improvement in the art of communications to increase throughput and improve performance.

BRIEF DESCRIPTION OF THE SEVERAL VIEWS OF THE DRAWINGS

FIG. 1A is a diagram illustrating an embodiment of one or more communication systems.

FIG. 1B is a diagram illustrating another embodiment of one or more communication systems.

FIG. 3A is a diagram illustrating an example of a packet stream that is temporarily stored into buffers and output therefrom as directed by a processor.

FIG. 3B is a diagram illustrating an example of different profiles used for communications.

FIG. 4A is a diagram illustrating an example of orthogonal frequency division multiplexing (OFDM) and/or orthogonal frequency division multiple access (OFDMA).

FIG. 4B is a diagram illustrating another example of OFDM and/or OFDMA.

FIG. 4C is a diagram illustrating another example of OFDM and/or OFDMA.

FIG. 4D is a diagram illustrating another example of OFDM and/or OFDMA.

FIG. 4E is a diagram illustrating an example of single-carrier (SC) signaling.

FIG. 5A is a diagram illustrating an embodiment of a method for execution by one or more communication devices.

FIG. 5B is a diagram illustrating another embodiment of a method for execution by one or more communication devices.

DETAILED DESCRIPTION

Figures 2A, 2B:
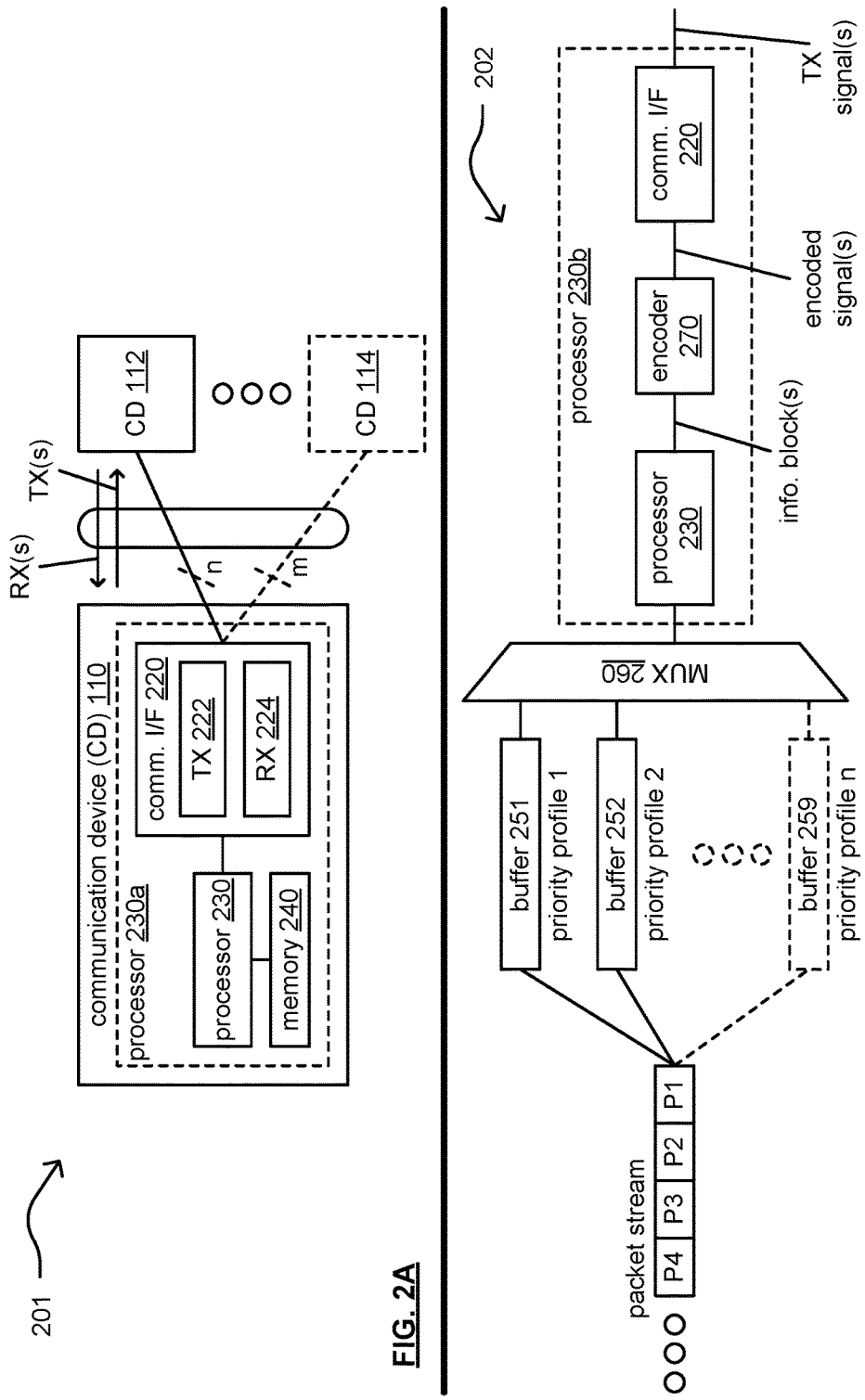
FIG. 2A is a diagram illustrating an example of a communication device operative within one or more communication systems.
FIG. 2B is a diagram illustrating example of at least a portion of a communication device operative within one or more communication systems.

FIG. 1A is a diagram illustrating an embodiment 101 of one or more communication systems. One or more network segments 116 provide communication inter-connectivity for at least two communication devices 110 and 112 (also referred to as communication devices in certain locations in the diagrams). Note that general reference to a communication device may be made generally herein using the term 'device' (e.g., device 110 or CD 110 when referring to communication device 110, or devices 110 and 112, or CDs 110 and 112, when referring to communication devices 110 and 112; note that CD is used in certain diagrams for brevity). Generally speaking, any desired number of communication devices are included within one or more communication systems (e.g., as shown by communication device 114).

The various communication links within the one or more network segments 116 may be implemented using any of a variety of communication media including communication links implemented as wireless, wired, optical, satellite, microwave, and/or any combination thereof, etc. communication links. Also, in some instances, communication links of different types may cooperatively form a connection pathway between any two communication devices. Considering one possible example, a communication pathway between devices 110 and 112 may include some segments of wired communication links and other segments of optical communication links. Note also that the devices 110-114 may be of a variety of types of devices including stationary devices, mobile devices, portable devices, etc. and may support communications for any of a number of services or service flows including data, telephony, television, Internet, media, synchronization, etc.

In an example of implementation, device 110 includes a communication interface to support communications with one or more of the other devices 112-114. This communication may be bidirectional/to and from the one or more of the other devices 112-114 or unidirectional (or primarily unidirectional) from the one or more of the other devices 112-114.

In another example of implementation, device 110 includes a communication interface and/or a processor (and possibly other possible circuitries, components, elements, etc.) to support communications with other device(s) and to generate and process signals for such communications. The communication interface and/or the processor operate to perform various operations and functions to effectuate such communications.

In an example of operation, one of the devices, such as device 110, includes a communication interface and/or a processor that operate to support communications with another device, such as device 112, among others within the system. For example, the processor is operative to generate and interpret different signals, frames, packets, symbols, etc. for transmission to other devices and that have been received from other devices.

In an example, a device (e.g., such as device 110) includes a communication interface and/or a processor (and possibly other possible circuitries, components, elements, etc.) to support communications with other device(s) and to generate and process signals for such communications. The communication interface and/or the processor operate to perform various operations and functions to effectuate such communications (e.g., the communication interface and the processor may be configured to perform certain operation(s) in conjunction with one another, cooperatively, dependently with one another, etc. and other operation(s) separately, independently from one another, etc.). In some examples, such a processor includes all capability, functionality, and/or circuitry, etc. to perform such operations as described herein. In some other examples, such a communication interface includes all capability, functionality, and/or circuitry, etc. to perform such operations as described herein. In even other examples, such a processor and a communication interface include all capability, functionality, and/or circuitry, etc. to perform such operations as described herein, at least in part, cooperatively with one another.

In an example of implementation and operation, the device 110 includes buffers, a processor, and an encoder, among other possible components. Note that various functionalities including encoder functionality may alternatively be implemented by and performed by such a processor within the device 110. The buffers are configured to store temporarily respective subsets of packets received via a packet stream and that are intended for transmission to one or more other communication devices (e.g., device 112, 114, etc.). In some examples, each buffer has a respective associated priority profile (e.g., a first buffer has a first priority profile, a second buffer has a second priority profile, etc.). The processor is configured to process a first subset of the packets included within a first buffer that has a first priority profile to determine whether any packet has been stored temporarily in the first buffer longer than a predetermined period of time.

This predetermined period of time may be a programmable threshold (e.g., a programmable period or threshold of time), and the predetermined period of time may be fixed, adaptive (e.g., based on any number of considerations), etc. When it is determined that at least one packet has been stored temporarily in the first buffer longer than the predetermined period of time, the processor generates and outputs a first information block that includes the first subset of the packets included within the first buffer. Alternatively, when it is determined that no packet has been stored temporarily longer in the first buffer longer than the predetermined period of time, the processor generates and outputs a second information block that includes a second subset of the packets included within a second buffer. In some examples, the second buffer has a second priority profile that is lower than the first priority profile. The processor provides these information blocks (e.g., first and/or second) to undergo encoding using at least one error checking and correction (ECC) and/or forward error correction (FEC) to generate an encoded signal for transmission to the one or more other communication devices (e.g., device 112, 114, etc.). In some examples, an encoder is configured to encode the first information block and/or the second information block to generate at least one encoded signal for transmission to the one or more other communication devices (e.g., device 112, 114, etc.).

In an example of implementation and operation, the device 110 generally operates to generate information blocks to undergo ECC and/or FEC to generate encoded signals for transmission to the one or more other communication devices (e.g., device 112, 114, etc.). The device 110 operates to select packet from the various buffers to operate in accordance with one or more latency constraints so that various service flows, data types, data priorities, etc. are effectively serviced and are timely provided to the one or more other communication devices (e.g., device 112, 114, etc.).

FIG. 1B is a diagram illustrating another embodiment 102 of one or more communication systems. A cable headend transmitter 130 provides service to a set-top box (STB) 122 via cable network segment 198. The STB 122 provides output to a display capable device 120. The cable headend transmitter 130 can support any of a number of service flows such as audio, video, local access channels, as well as any other service of cable systems. For example, the cable headend transmitter 130 can provide media (e.g., video and/or audio) to the display capable device.

The cable headend transmitter 130 may provide operation of a cable modem termination system (CMTS) 140a. For example, the cable headend transmitter 130 may perform such CMTS functionality, or a CMTS may be implemented separately from the cable headend transmitter 130 (e.g., as shown by reference numeral 140). The CMTS 140 can provide network service (e.g., Internet, other network access, etc.) to any number of cable modems (shown as CM 1, CM 2, and up to CM n) via a cable modem (CM) network segment 199. The cable network segment 198 and the CM network segment 199 may be part of a common network or common networks. The cable modem network segment 199 couples the cable modems 1-*n* to the CMTS (shown as 140 or 140*a*). Such a cable system (e.g., cable network segment 198 and/or CM network segment 199) may generally be referred to as a cable plant and may be implemented, at least in part, as a hybrid fiber-coaxial (HFC) network (e.g., including various wired and/or optical fiber communication segments, light sources, light or photo detection components, etc.).

A CMTS 140 (or 140*a*) is a component that exchanges digital signals with cable modems 1-*n* on the cable modem network segment 199. Each of the cable modems is coupled to the cable modem network segment 199, and a number of elements may be included within the cable modem network segment 199. For example, routers, splitters, couplers, relays, and amplifiers may be contained within the cable modem network segment 199. Generally speaking, downstream information may be viewed as that which flows from the CMTS 140 to the connected cable modems (e.g., CM 1, CM 2, etc.), and upstream information as that which flows from the cable modems to the CMTS 140.

In an example of implementation and operation, the CMTS 140 (or CMTS 140*a*) includes codeword builder functionality. Such codeword builder functionality operates to generate information blocks to undergo subsequent ECC and/or FEC coding. The CMTS 140 (or CMTS 140*a*) includes buffers, a processor, an encoder, and a communication interface. The buffers are configured to store temporarily respective subsets of packets received via a packet stream and intended for transmission to one or more other communication devices (e.g., CM 1, CM 2, etc.). Each buffer has a respective associated priority profile (e.g., first priority profile, second priority profile, etc.). The processor is configured to process a first subset of the packets included within a first buffer that has a first priority profile to determine whether any packet has been stored temporarily in the first buffer longer than a predetermined period of time. This predetermined period of time may be a programmable threshold (e.g., a programmable period or threshold of time), and the predetermined period of time may be fixed, adaptive (e.g., based on any number of considerations), etc.

When it is determined that at least one packet has been stored temporarily in the first buffer longer than the predetermined period of time, the processor generates and outputs a first information block that includes the first subset of packets included within the first buffer. When it is determined that no packet has been stored temporarily longer in the first buffer longer than the predetermined period of time, the processor generates and outputs a second information block that includes a second subset of packets included within a second buffer that has a second priority profile. This second buffer may have a second priority profile that is lower than the first priority profile. Also, in some examples, the first subset of packets included within the first buffer occupies less than a first storage capacity of the first buffer, and/or the second subset of the packets included within the second buffer occupies less than a second storage capacity of the second buffer. The processor may be configured to generate information blocks using information temporarily stored within the buffers when the buffers are less than completely full. For example, when it is determined to generate an information block using packets within a given buffer having a given priority profile, the processor may do so even when the buffer is less than completely full. The processor then generates the information block based on whatever packets are included within that particular buffer.

In this example of implementation and operation, the encoder is configured to encode the first information block to generate a first encoded signal and to encode the second information block to generate a second encoded signal. The communication interface is configured to transmit the first encoded signal and the second encoded signal to one or more other communication devices (e.g., CM 1, CM 2, etc.).

In some examples, the encoder is configured to perform any appropriate processing on the information blocks provided from the processor to generate an appropriate sized information block to undergo ECC and/or FEC coding in accordance with one or more coding processes. For example, the various information blocks provided from the processor may be of different sizes, and the encoder may be configured to perform any appropriate processing (e.g., adding bits such fill bits, 0-valued bits, dummy bits, etc.) to generate appropriate sized information blocks for subsequent processing therein.

FIG. 2A is a diagram illustrating an example 201 of a communication device operative within one or more communication systems. The device 110 includes a communication interface 220 and a processor 230. The communication interface 220 includes functionality of a transmitter 222 and a receiver 224 to support communications with one or more other devices within a communication system. The device 110 may also include memory 240 to store information including one or more signals generated by the device 110 or such information received from other devices (e.g., device 112) via one or more communication channels. Memory 240 may also include and store various operational instructions for use by the processor 230 in regards to the processing of messages and/or other received signals and generation of other messages and/or other signals including those described herein. Memory 240 may also store information including one or more types of encoding, one or more types of symbol mapping, concatenation of various modulation coding schemes, etc. as may be generated by the device 110 or such information received from other devices via one or more communication channels. The communication interface 220 supports communications to and from one or more other devices (e.g., CD 112 and/or other communication devices such as CD 114). Operation of the communication interface 220 may be directed by the processor 230 such that processor 230 transmits and receives signals (TX(s) and RX(s)) via the communication interface 220.

Generally speaking, the communication interface 220 is implemented to perform any such operations of an analog front end (AFE) and/or physical layer (PHY) transmitter, receiver, and/or transceiver. Examples of such operations may include any one or more of various operations including conversions between the frequency and analog or continuous time domains (e.g., such as the operations performed by a digital to analog converter (DAC) and/or an analog to digital converter (ADC)), gain adjustment including scaling, filtering (e.g., in either the digital or analog domains), frequency conversion (e.g., such as frequency upscaling and or frequency downscaling, such as to a baseband frequency at which one or more of the components of the device 110 operates), equalization, pre-equalization, metric generation, symbol mapping and/or de-mapping, automatic gain control (AGC) operations, and/or any other operations that may be performed by an AFE and/or PHY component within a communication device.

Note that device 110 may be implemented to operate as any one or more of a satellite communication device, a wireless communication device, a wired communication device, a fiber-optic communication device, or a mobile communication device and implemented and/or operative within any one or more communication systems including a satellite communication system, a wireless communication system, a wired communication system, a fiber-optic communication system, or a mobile communication system.

Also, in some examples, note that one or more of the processor 230, the communication interface 220 (including the TX 222 and/or RX 224 thereof), and/or the memory 240 may be implemented in one or more "processing modules," "processing circuits," "processors," and/or "processing units". Considering one example, one processor 230a may be implemented to include the processor 230, the communication interface 220 (including the TX 222 and/or RX 224 thereof), and the memory 240. Considering another example, two or more processors may be implemented to include the processor 230, the communication interface 220 (including the TX 222 and/or RX 224 thereof), and the memory 240. In such examples, such a "processor" or "processors" is/are configured to perform various operations, functions, communications, etc. as described herein. In general, the various elements, components, etc. shown within the device 110 may be implemented in any number of "processing modules," "processing circuits," "processors," and/or "processing units" (e.g., 1, 2, . . . , and generally using N such "processing modules," "processing circuits," "processors," and/or "processing units", where N is a positive integer greater than or equal to 1).

Note that the memory 240 may be implemented as a number of buffers configured to receive packets of a packet stream and to store them temporarily, and each of the buffers may have a different respective priority profile.

FIG. 2B is a diagram illustrating example 202 of at least a portion of a communication device operative within one or more communication systems. The device receives a packet stream that includes packets (e.g., P1, P2, P3, P4, and so on, etc.). Note that these packets may be associated with different service flows, data types, have different priorities, etc. The packets of the packet stream are stored temporarily in buffers (e.g., buffer 251 having a priority profile 1, buffer 252 having a priority profile 2, etc. and may optionally include more than two buffers such as up to buffer 259 having a priority profile n). Generally, the different buffers have different priority profiles and may be relatively scaled such that priority profile 1 has a greater priority than priority profile 2 and so on in one example. The buffers 251-259 are configured to store temporarily respective subsets of packets received via the packet stream and intended for transmission to one or more other communication devices. For example, P1 may be stored in buffer 251, P2 may be stored in buffer 252, etc.

Via a multiplexer 260, processor 230 is configured to access any of the packets stored temporarily in buffers. The processor 230 is configured to process a first subset of the packets included within buffer 251 that has priority profile 1 to determine whether any packet has been stored temporarily in the buffer 251 longer than a predetermined period of time. This particular predetermined period of time may be a programmable threshold. When the processor 230 determines that at least one packet has been stored temporarily in the buffer 251 longer than the predetermined period of time, the processor 230 generates and outputs a first information block that includes the packets stored temporarily within the buffer 251. Alternatively, when the processor 230 determines that no packet has been stored temporarily longer in the buffer 251 longer than the predetermined period of time, the processor 230 generates and outputs a second information block that includes a second subset of packets included within another buffer (e.g., buffer 251 that has a priority profile 2 that is lower than the priority profile 1).

The processor 230 provides information block(s) to encoder 270 that is configured to encode the information block(s) to generate encoded signal(s) for transmission to the one or more other communication devices via communication interface 220 that outputs transmission (TX) signal(s).

In another example, when it is determined that no packet has been stored temporarily longer in the buffer 251 longer than the predetermined period of time, the processor is further configured firstly to generate and output the second information block that includes the second subset of the packets included within the buffer 252 and secondly to generate and output the first information block that includes the first subset of the packets included within the buffer 251.

In another example, when it is determined that no packet has been stored temporarily longer in the buffer 251 longer than the predetermined period of time, the processor is further configured to process remaining packets stored temporarily within remaining buffers 251 and optionally through 259 (e.g., those buffers that exclude the buffer 251) to identify another buffer in which a packet has been stored temporarily longer than any other packet of the remaining packets stored temporarily within the remaining buffers. When such an associated packet and buffer are identified, the processor 230 generates and outputs another information block that includes another subset of the packets included within that other identified buffer (e.g., that includes the packet stored temporarily longest). Then, the encoder 270 is configured to encode this other information block to generate another encoded signal for transmission to at least one communication device of the one or more other communication devices via the communication interface 220.

Note also that the processor 230 is configured to generate information blocks using the respective packets stored in a given buffers even when that buffer is not at full storage capacity. For example, the processor 230 can generate an information block using a subset of packets included within buffer 251 that occupy less than a full storage capacity of the buffer 251. Similarly, the processor 230 can generate information blocks using subset of packets from other buffers even when the storage therein is less than full storage capacity of those buffers. Note also that the buffers can be implemented to store temporarily a particular number of packets (e.g., n packets, where n may be 2, 3, 4, etc. or any positive integer). Considering an example where the buffers can store n packets each, then the processor 230 can generate information blocks that include any number of packets between 1 and n (e.g., 1, 2, or up to n). In some example, all of the buffers are implemented to store a same number of packets. In other example, different buffers are implemented to store different numbers of packets.

In another example, the encoder 270 is configured to encode a first information block to generate a first encoded signal and to encode a second information block to generate a second encoded signal. The communication interface 220 is configured to transmit the first encoded signal to a first communication device using a first profile that includes first operational parameters that are selected based on a first communication pathway between the communication device and the first communication device and also to transmit the second encoded signal to a second communication device of the one or more other communication devices using a second profile that includes second operational parameters that are selected based on a second pathway between the communication device and the second communication device. In some examples, the first profile specifies a first at least one corresponding modulation for a first plurality of sub-carriers of a first at least one orthogonal frequency division multiplexing (OFDM) channel, and the second profile specifies a second at least one corresponding modulation for a second plurality of sub-carriers of a second at least one OFDM channel.

Note that such a communication device that includes capability, components, functionality, etc. as described herein may be configured to support point-to-multipoint communications with a plurality of other communication devices within any of a satellite communication system, a wireless communication system, a wired communication system, a fiber-optic communication system, or a mobile communication system and/or a communication system that includes any combination of such systems.

Note that a processor such as processor 230b may include components, circuitry, etc. to perform various operations (e.g., the processor 230b may include functionality to perform operations associated with the processor 230, encoder 270, and communication interface 220). In alternative examples, a processor may also be implemented to include functionality to perform operations associated with the MUX 260, the buffers 251-259, etc.

FIG. 3A is a diagram illustrating an example 301 of a packet stream that is temporarily stored into buffers and output therefrom as directed by a processor. A packet stream includes packets P1, P2, P3, P4, P5, P6, P7, P8, 09, P10, P11, P12, P13, and so on. Buffer 251 that has priority profile 1 temporarily stores packets P1, P3, P6, and P9. Buffer 252 that has priority profile 2 temporarily stores packets P2, P5, and P8. Buffer 253 that has priority profile 3 temporarily stores packets P4, P7, P10, and P11. Buffer 254 that has priority profile 4 temporarily stores packets P12 and P13. A processor generates different information blocks using the packets respectively temporarily stored in the various buffers 251-254. For example, a processor generates a first information block using the packets P2, P5, and P8 temporarily stored in buffer 252. The processor then generates a second information block using the packets P1, P3, P6, and P9 temporarily stored in buffer 251. The processor then generates a third information block using the packets P12 and P13 temporarily stored in buffer 254. The processor then generates a fourth information block using the packets P4, P7, P10, and P11 temporarily stored in buffer 252. Such a processor intelligently selects packets from the various buffers 251-254 to generate information blocks to be output (e.g., to an encoder) while complying with one or more latency requirements, constraints, etc. Note that various information blocks generated based on subsets of the packet stream may be of different sizes and may be based on packets that occupy less than a full storage capacity of the buffers.

FIG. 3B is a diagram illustrating an example 302 of different profiles used for communications. A profile 311 includes operational parameters 312, a profile 321 includes operational parameters 322, etc. Examples of operational parameters may include any one or more operational parameters used to effectuate communications. For example, operational parameters 312 may include any or more of modulation 313, modulation coding set (MCS) 314, a transmit (TX) power 315, a specific one or more sub-carriers/tones 316, and/or any other parameter 317. Operational parameters 322 may include any or more of modulation 323, MCS 324, a TX power 325, a specific one or more sub-carriers/tones 326, and/or any other parameter 327. The operational parameters 312 and the operational parameters 322 may include any one or more similar or same operational parameters in some examples or may include entirely different operational parameters in other examples. Examples of modulations may include binary phase shift keying (BPSK), quadrature phase shift keying (QPSK), 8-phase shift keying (PSK), 16 quadrature amplitude modulation (QAM), 32 amplitude and phase shift keying (APSK), etc., uncoded modulation, and/or any other desired types of modulation including higher ordered modulations that may include even greater number of constellation points (e.g., 1024 QAM, etc.). Examples of MCS may include MCS0, MCS1, etc. such as may be defines in accordance with a communication standard, protocol, and/or recommended practice. Examples of sub-carriers/tones may be associated with orthogonal frequency division multiple access (OFDMA) mappings such as described with reference to FIG. 4A-4E below. Other examples of sub-carriers/tones may be associated with sub-carriers/tones of respective OFDM/A channels such as described with reference to FIG. 4A-4E below.

FIG. 4A is a diagram illustrating an example 401 of orthogonal frequency division multiplexing (OFDM) and/or orthogonal frequency division multiple access (OFDMA). OFDM's modulation may be viewed as dividing up an available spectrum into a plurality of narrowband sub-carriers (e.g., relatively lower data rate carriers). The sub-carriers are included within an available frequency spectrum portion or band. This available frequency spectrum is divided into the sub-carriers or tones used for the OFDM or OFDMA symbols and packets/frames. Note that sub-carrier or tone may be used interchangeably. Typically, the frequency responses of these sub-carriers are non-overlapping and orthogonal. Each sub-carrier may be modulated using any of a variety of modulation coding techniques (e.g., as shown by the vertical axis of modulated data).

A communication device may be configured to perform encoding of one or more bits to generate one or more coded bits used to generate the modulation data (or generally, data). For example, a processor and the communication interface of a communication device may be configured to perform forward error correction (FEC) and/or error checking and correction (ECC) code of one or more bits to generate one or more coded bits. Examples of FEC and/or ECC may include turbo code, convolutional code, turbo trellis coded modulation (TTCM), low density parity check (LDPC) code, Reed-Solomon (RS) code, BCH (Bose and Ray-Chaudhuri, and Hocquenghem) code, binary convolutional code (BCC), Cyclic Redundancy Check (CRC), and/or any other type of ECC and/or FEC code and/or combination thereof, etc. Note that more than one type of ECC and/or FEC code may be used in any of various implementations including concatenation (e.g., first ECC and/or FEC code followed by second ECC and/or FEC code, etc. such as based on an inner code/outer code architecture, etc.), parallel architecture (e.g., such that first ECC and/or FEC code operates on first bits while second ECC and/or FEC code operates on second bits, etc.), and/or any combination thereof. The one or more coded bits may then undergo modulation or symbol mapping to generate modulation symbols. The modulation symbols may include data intended for one or more recipient devices. Note that such modulation symbols may be generated using any of various types of modulation coding techniques. Examples of such modulation coding techniques may include binary phase shift keying (BPSK), quadrature phase shift keying (QPSK), 8-phase shift keying (PSK), 16 quadrature amplitude modulation (QAM), 32 amplitude and phase shift keying (APSK), etc., uncoded modulation, and/or any other desired types of modulation including higher ordered modulations that may include even greater number of constellation points (e.g., 1024 QAM, etc.).

FIG. 4B is a diagram illustrating another example 402 of OFDM and/or OFDMA. A transmitting device transmits modulation symbols via the sub-carriers. Note that such modulation symbols may include data modulation symbols, pilot modulation symbols (e.g., for use in channel estimation, characterization, etc.) and/or other types of modulation symbols (e.g., with other types of information included therein). OFDM and/or OFDMA modulation may operate by performing simultaneous transmission of a large number of narrowband carriers (or multi-tones). In some applications, a guard interval (GI) or guard space is sometimes employed between the various OFDM symbols to try to minimize the effects of ISI (Inter-Symbol Interference) that may be caused by the effects of multi-path within the communication system, which can be particularly of concern in wireless communication systems. In addition, a cyclic prefix (CP) and/or cyclic suffix (CS) (shown in right hand side of FIG. 4A) that may be a copy of the CP may also be employed within the guard interval to allow switching time (e.g., such as when jumping to a new communication channel or sub-channel) and to help maintain orthogonality of the OFDM and/or OFDMA symbols. Generally speaking, an OFDM and/or OFDMA system design is based on the expected delay spread within the communication system (e.g., the expected delay spread of the communication channel).

In a single-user system in which one or more OFDM symbols or OFDM packets/frames are transmitted between a transmitter device and a receiver device, all of the sub-carriers or tones are dedicated for use in transmitting modulated data between the transmitter and receiver devices. In a multiple user system in which one or more OFDM symbols or OFDM packets/frames are transmitted between a transmitter device and multiple recipient or receiver devices, the various sub-carriers or tones may be mapped to different respective receiver devices as described below with respect to FIG. 4C.

FIG. 4C is a diagram illustrating another example 403 of OFDM and/or OFDMA. Comparing OFDMA to OFDM, OFDMA is a multi-user version of the popular orthogonal frequency division multiplexing (OFDM) digital modulation scheme. Multiple access is achieved in OFDMA by assigning subsets of sub-carriers to individual recipient devices or users. For example, first sub-carrier(s)/tone(s) may be assigned to a user 1, second sub-carrier(s)/tone(s) may be assigned to a user 2, and so on up to any desired number of users. In addition, such sub-carrier/tone assignment may be dynamic among different respective transmissions (e.g., a first assignment for a first packet/frame, a second assignment for second packet/frame, etc.). An OFDM packet/frame may include more than one OFDM symbol. Similarly, an OFDMA packet/frame may include more than one OFDMA symbol. In addition, such sub-carrier/tone assignment may be dynamic among different respective symbols within a given packet/frame or superframe (e.g., a first assignment for a first OFDMA symbol within a packet/frame, a second assignment for a second OFDMA symbol within the packet/frame, etc.). Generally speaking, an OFDMA symbol is a particular type of OFDM symbol, and general reference to OFDM symbol herein includes both OFDM and OFDMA symbols (and general reference to OFDM packet/frame herein includes both OFDM and OFDMA packets/frames, and vice versa). FIG. 4C shows example 403 where the assignments of sub-carriers to different users are intermingled among one another (e.g., sub-carriers assigned to a first user includes non-adjacent sub-carriers and at least one sub-carrier assigned to a second user is located in between two sub-carriers assigned to the first user). The different groups of sub-carriers associated with each user may be viewed as being respective channels of a plurality of channels that compose all of the available sub-carriers for OFDM signaling.

FIG. 4D is a diagram illustrating another example 404 of OFDM and/or OFDMA. In this example 404, the assignments of sub-carriers to different users are located in different groups of adjacent sub-carriers (e.g., first sub-carriers assigned to a first user include first adjacently located sub-carrier group, second sub-carriers assigned to a second user include second adjacently located sub-carrier group, etc.). The different groups of adjacently located sub-carriers associated with each user may be viewed as being respective channels of a plurality of channels that compose all of the available sub-carriers for OFDM signaling.

FIG. 4E is a diagram illustrating an example 405 of single-carrier (SC) signaling. SC signaling, when compared to OFDM signaling, includes a singular relatively wide channel across which signals are transmitted. In contrast, in OFDM, multiple narrowband sub-carriers or narrowband sub-channels span the available frequency range, bandwidth, or spectrum across which signals are transmitted within the narrowband sub-carriers or narrowband sub-channels.

Generally, a communication device may be configured to include a processor and the communication interface (such as processor 230 and communication interface 220 in FIG. 2A or alternatively a processor that includes communication interface functionality, such a processor 230a shown in FIG. 2A) configured to process received OFDM and/or OFDMA symbols and/or frames (and/or SC symbols and/or frames) and to generate such OFDM and/or OFDMA symbols and/or frames (and/or SC symbols and/or frames).

Note that the various communication devices as described herein and their equivalents may be configured to generate signals using any of the various types of signals, communications, etc. as described herein and their equivalents, any OFDM/OFDMA signaling scheme as described herein and their equivalents, and/or using any desired modulation, profile, etc. as described herein and their equivalents.

FIG. 5A is a diagram illustrating an embodiment of a method 501 for execution by one or more communication devices. Within buffers, the method 501 operates by storing temporarily respective subsets of packets received via a packet stream and intended for transmission to one or more other communication devices (block 510). In an example, each buffer has a respective associated priority profile. The method 501 continues by processing a first subset of packets included within a first buffer that has a first priority profile to the duration that packets are stored temporarily therein stored temporarily. The method 501 continues by determining whether any packet has been stored temporarily in the first buffer longer than a predetermined period of time, which may be a programmable threshold of time (decision block 520).

When it is determined that at least one packet has been stored temporarily in the first buffer longer than the predetermined period of time, the method 501 operates by generating and outputting a first information block that includes the first subset of the packets included within the first buffer (block 530).

When it is determined that no packet has been stored temporarily longer in the first buffer longer than the predetermined period of time, the method 501 operates by generating and outputting a second information block that includes a second subset of the packets included within a second buffer that has a second priority profile that is lower than a first priority profile of the first buffer (block 540).

The method 510 then continues by encoding the first information block (or the second information block) to generate encoded signal(s) for transmission to the one or more other communication devices (block 550).

FIG. 5B is a diagram illustrating another embodiment of a method 502 for execution by one or more communication devices. When it is determined that no packet has been stored temporarily longer in a first buffer longer than a predetermined period of time, the method 502 operates by processing remaining packets stored temporarily within remaining buffers that exclude the first buffer to determine the duration that packets are stored temporarily therein (block 511). The method 502 operates by identifying another buffer in which a packet has been stored temporarily longer than any other packet(s) of the remaining packets stored temporarily within the remaining buffers (block 521). The method 502 continues by generating and outputting another information block that includes this other subset of packets included within this other buffer (block 531). The method 502 then operates by encoding this other information block to generate another encoded signal for transmission to at least one communication device of the one or more other communication devices (block 541).

In certain examples of communication devices and/or methods (e.g., including those that may be designed to comply with DOCSIS 3.0), the modulation order and bandwidth of a downstream channel are both fixed (e.g., chosen from a small number of predetermined options). Note that modulation order may be viewed to refer to such characteristics such as one or more of number of bits per symbol, constellation shape, constellation size, etc. such as quadrature phase shift keying (QPSK), 8 phase shift keying (8-PSK), 16 quadrature amplitude modulation (QAM), 32-amplitude and phase shift keying (APSK), 63 QAM, etc. where those with relatively more number of bits per symbol and relatively larger constellation size with relatively more constellation points have "higher order" than those with relatively fewer number of bits per symbol and relatively smaller constellation size with relatively fewer constellation points.

However, in certain other examples of communication devices and/or methods including those that may operate as described herein (e.g., including those that may be designed to comply with DOCSIS 3.1), modulation order, bandwidth, and/or other operational parameters of a downstream channel may be dependent on a communication profile such as described with reference to FIG. 3B. Across various profiles, modulation order, bandwidth, and/or other parameters may vary from profile to profile or even be modifies within a given profile over time. For example, a DOCSIS 3.1 OFDM downstream channel has some (e.g., configurable) number of active sub-carriers which may be used to carry data, and each sub-carrier may have a different modulation order. A "profile" may specify a particular table of modulation orders per sub-carrier. Multiple profiles may be provided on the same downstream channel in order to optimize throughput for different plant conditions seen by different receivers.

Note that many examples are described herein use communication devices as CMTS and CMs for illustration (e.g., such as with reference to FIG. 1B). However, note that such functionality may generally be applied to any type of communication systems with any type of communication devices. In general, in these examples, a "transmitter" may be viewed a first communication device, a "receiver" may be viewed a second communication device, or vice versa, and so on. Also, in some of these examples, a "CMTS" may be viewed a first communication device such as a transmitter, and a "CM" may be viewed a second communication device such as a receiver, or vice versa, and so on. Note that any such communication devices may also include transceiver functionality (e.g., both transmitter and receiver) functionality.

The DOCSIS downstream is point-to-multipoint communications (e.g., one to many communication configuration). In one example, one CMTS transmitter reaches many CM receivers such that different receivers may see different SNR per sub-carrier depending on where they are located on the cable plant. For instance, a CM located at the end of a long drop cable may see lower SNR at higher frequencies due to high tilt over the drop. This CM would be best served by a profile using higher modulation orders at lower frequencies and lower modulation orders at higher frequencies. A different CM might be located close to an amplifier, behind a tap with high attenuation, and with a short drop cable. This CM might be best served by a profile using a moderate modulation order across all frequencies (since the high attenuation might preclude high modulation orders). Yet another CM might be located close to a cell tower which interferes with certain frequencies in the middle of the downstream channel; this CM would require a profile with a modulation order of zero at the frequencies being interfered with, and nonzero modulation orders at other frequencies. For example, a transmitter communication device (e.g., transmitter) may be configured to transmit encoded signals to receiver communication devices (e.g., receivers) using appropriate profiles that includes operational parameters that are selected based on communication pathways between the transmitter and the receivers. The transmitter may communicate to the same receiver using different profiles, and a given receiver may be configured to receive communications based on more than one profile.

If only a single profile were allowed on a channel (e.g., such as a channel servicing many receivers), this profile would have to be the "lowest common denominator" accounting for all impairments present on the cable plant. For instance, if all of the example cases above existed on the same downstream channel, the single profile would have to have low modulation orders at high frequencies, no more than moderate modulation orders at other frequencies, and a band of zero modulation order at the frequencies interfered with by the cell tower (e.g., even though not all receivers (e.g., CMs) are affected by that modulation). By allowing multiple profiles, overall channel performance can be improved because each CM can be addressed using the best possible profile for that device. For example, the frequencies that are not usable for the receiver (e.g., CM) seeing cell tower interference could still be used for packets addressed to either of the other two receivers (e.g., CMs).

In practice within a cable based communication system, the number of receivers (e.g., CMs) on a cable plant can be very large and much larger than 3 (e.g., sometimes dozens to hundreds or more). It may not be considered practical to have a different profile for each and every CM in the system. The drain on system resources may be very large and the benefit very small using a very high number of profiles since the variability of plant conditions may not be very large for cable systems as it is for other communication system types (e.g., wireless). In some examples (e.g., DOCSIS 3.1), a certain number of profiles (e.g., 16) may be allowed on a single downstream channel. In some notations and conventions, these different profiles may be referred to by capital letters ("Profiles A, B, C, etc."); in other examples, these different profiles may be referred to by different numbers (e.g., "Profiles 1, 2, 3, etc."). Receivers (e.g., CMs) may be assigned to receive one or more profiles. Typically, receivers (e.g., CMs) will be assigned to use "Profile A," which is used for initialization and/or ranging, etc. and certain types of management packets, and typically also for broadcast traffic. Multicast traffic may also be carried on Profile A. Profile A is intended to be configured as a "lowest common denominator" profile that is heard by all modems (e.g., receivers, CMs). Each modem (e.g., receiver, CM) is typically also assigned one or more additional profiles, typically with higher throughput than Profile A (using higher modulation orders where possible), and these profiles would be used for unicast and possibly some multicast traffic.

When transmitting, the transmitter (e.g., CMTS) chooses which profile to use for a given packet based on the packet's destination. In an example of operation, each DOCSIS Service Flow is assigned to use a specific profile on a given channel. For unicast flows, the profile is chosen from among those assigned to the destination receiver (e.g., CM). For multicast or broadcast flows, the profile is one that is assigned to all receivers (e.g., CMs) to be reached by the flow.

From this, it can be seen that the choice of profiles to be used on the channel at any given moment depends on the mix of traffic at that moment. This can depend on which receivers (e.g., CMs) are to be reached by the currently available traffic and what profiles those receivers (e.g., CMs) are using to receive the Service Flows the traffic has been classified to. In an example of operation, if all of the traffic at a given moment is broadcast traffic, Profile A will be used and channel throughput will be at the "lowest common denominator" rate. At another moment, if all of the traffic is unicast traffic for high-SNR modems (e.g., CMs), profiles with higher modulation orders would be used and the channel throughput would be higher. Thus, the instantaneous channel rate and also the rate over time will vary depending on the traffic mix.

Not all modems (e.g., CMs) are capable of receiving all profiles. Some modems (e.g., CMs) will not have enough SNR and/or will suffer from interference that prevents them from receiving certain profiles. In addition, modems (e.g., CMs) receive only profiles they are assigned to receive, up to a maximum of four at once in the current DOCSIS spec. A modem must be able to completely decode what it receives on profiles it can/does receive, without depending on information from any other profile. This means that error checking and correction (ECC) and/or forward error correction (FEC) coding must be complete within a profile (e.g., the smallest unit of traffic that can be sent at once on a given profile is a complete FEC codeword). Note that many examples described herein operate based on sending a codeword on [or using] a profile.

In an example based on DOCSIS 3.1, the downstream channel contains a structure that includes an "NCP" (next codeword pointer), which is independent of the data-carrying profiles and contains information about where each codeword starts and what profile it is using. The modem (e.g., CM) decodes the NCPs and uses this information to locate codewords that were sent on profiles it has been assigned to receive. The DOCSIS 3.1 downstream uses an LDPC FEC code plus a BCH outer code. Codewords may be "full" or "shortened". "Full" codewords contain the maximum number of information bits allowed by the codes in question, plus the requisite number of parity bits. "Shortened" codewords contain the same number of parity bits, but fewer information bits. They are used when the transmitter does not have enough data to send on the profile to fill a full codeword. In this case, shortening the codeword is more efficient than filling up the rest of a full codeword with "stuff" (useless) bytes. The codeword is sent using only the data that is available, and then the rest of the channel can be used for other codewords on other profiles. However, shortened codewords are less efficient than full codewords, since the ratio of information bits to total (information+parity) bits is lower. Lower efficiency ultimately lowers throughput since less of the channel is used for actual information bits.

In some examples, to maximize efficiency, the transmitter (e.g., CMTS) would always send full codewords. If it did not have enough traffic on a given profile to fill a codeword, it would wait for more traffic to arrive. Once it had enough bits to fill a codeword, it would do so, and then save any leftover bits on the profile to send later after yet more traffic has arrived. In principle, this is easy to do since codeword boundaries do not have to be aligned with packet boundaries.

At least one problem with the above strategy is that it could create long delays while the transmitter (e.g., CMTS) waits for traffic to arrive on a profile. The DOCSIS specification suggests delay bounds as low as 200 micro-seconds (µsec) on this profile/codeword scheduling ("codeword builder") function. As described above, which profiles get used depends on which modems (e.g., CMs) are active at any given moment, which can be difficult or impossible to predict or control. Even if traffic is relatively balanced across all profiles at a macro level (e.g., such as within seconds or tens of seconds), the balance of profiles to be used is very unpredictable at the level of a 200 µsec time slice.

One potential solution operates such that, when holding traffic for a profile that is insufficient to fill a codeword, the transmitter (e.g., CMTS) might simply wait until almost the maximum suggested delay bound, and then if no traffic has arrived by that point, the (e.g., CMTS) sends a shortened codeword. However, this could be problematic by introducing delays very close to the maximum bounds at all times even when such delays may not be necessary. Also, if the transmitter (e.g., CMTS) is holding small amounts of traffic for multiple profiles, it may wait close to the maximum time and then suddenly receive additional traffic on all of these profiles at once. Then, it would have insufficient bandwidth to send all traffic within the desired delay bounds and it would fail to meet its requirements.

Also, there may be additional complexity in the need to manage delays when there are large numbers of profiles. The DOCSIS 3.1 specification recognizes that delays will tend to be longer when there are more profiles, since each profile could potentially have to wait behind a larger number of other profiles before its traffic can be sent. It is also recognized that lower channel bandwidth will tend to increase delays, since a full codeword takes more time to send on a slower channel. If each profile were treated equally in terms of latency, then in some cases, the latency would be too high to deliver certain services. For example, MEF 23-H service requires less than 8 milli-seconds (msec) of end-to-end latency, and this would be very difficult to achieve if the codeword builder function introduced 3 msec.

Figures 6A, 6B:
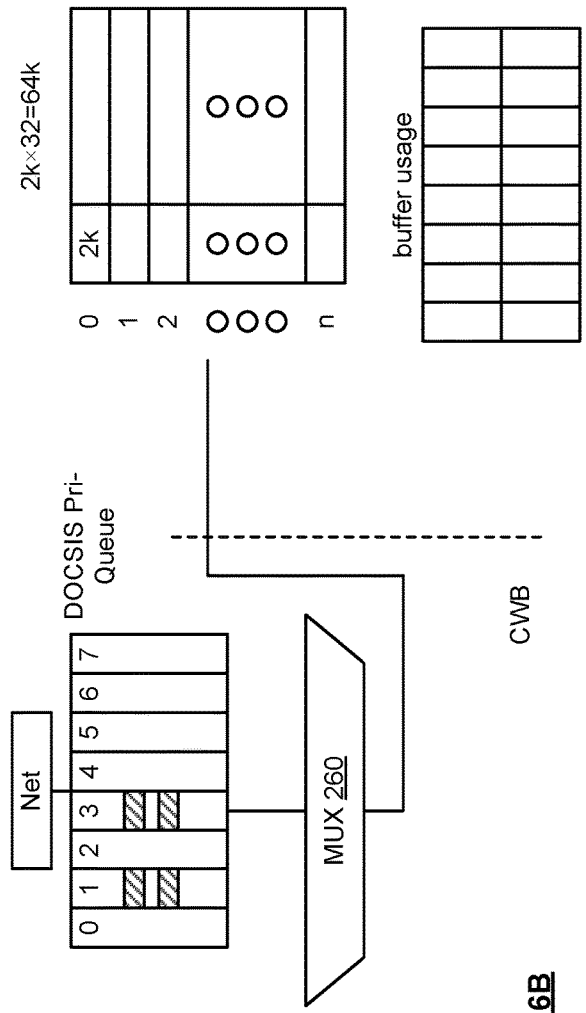
FIG. 6A is a diagram illustrating an example table showing codeword builder latency.
FIG. 6B is a diagram illustrating an example of codeword building.

FIG. 6A is a diagram illustrating an example table 601 showing codeword builder latency. Such codeword builder latency may be understood in view of a communication system that provides cable modem (CM) and cable modem termination system (CMTS) profile support.

Priority profiles may be used such that a small number of profiles will have a lower target latency than other profiles. The table below is taken from the DOCSIS 3.1 MULPI specification [1] section on "CM and CMTS Profile Support" and shows the recommended latency targets for a codeword builder.

[1] Data-Over-Cable Service Interface Specifications DOCSIS® 3.1, MAC and Upper Layer Protocols Interface Specification, CM-SP-MULPIv3.1-I06-150611, ISSUED Jun. 11, 2015, 816 pages.

For example, if there are 16 downstream profiles in the system, the associated specification recommends that 4 of these profiles have a lower target latency than the remaining 12. The actual target depends on channel bandwidth.

An operator who wants to use 16 profiles but is concerned about latency would be able to configure 4 profiles to have lower target latency, and assign Service Flows corresponding to low-latency services to use one of those "priority profiles."

Note that profiles do not necessarily correspond to Quality of Service (QoS) levels in this diagram. In some examples, QoS decisions are made at a higher layer in the DOCSIS MAC, based on DOCSIS Service Flows and other configured QoS parameters. Based on these QoS decisions, the MAC provides a stream of packets to the codeword builder. The codeword builder may make small changes in the order of data in the packet stream so as to fill codewords efficiently, but the changes it can make are limited by the latency bounds of the table (or similar bounds configured by the operator). Note that if the QoS engine has provided a stream of packets in the order they would ideally be sent, and the profiles for these packets are B, B, C, B, C, C, D, a codeword builder that is waiting for traffic to fill a codeword on Profile D cannot re-order the stream to put the profile D packet at the front. To do so would incorrectly "promote" that packet and induce additional delays on all the other packets that were supposed to be ahead of it. If this behavior occurred repeatedly, the delays on other profiles could accumulate and become much longer than allowed.

FIG. 6B is a diagram illustrating an example 602 of codeword building. Note that the codeword builder functionality (e.g., generating of information blocks from packets to undergo ECC and/or FEC coding) is separate from the QoS engine functionality and does not sort data by profile too soon in some examples. For example, considering this example 602, the QoS priority queues are at the left ("DOCSIS Pri-Queues" in the diagram). The per-profile buffers in the codeword builder are to the right of the line marked "CWB" (codeword builder), in the large box; buffer management logic is contained in the smaller box below. This is the buffer management, or "BUM," portion of the codeword builder; this portion is followed by the "scheduler" portion, which is not shown in the FIG. 6B. The codeword builder limits the amount of data that can be in its buffers at a given time in two ways: (1) the number and/or size of buffers that can be consumed by a given profile is limited; (2) the total number of buffers that can be consumed across all profiles is limited.

For example, if the highest priority packet coming out of the QoS queues is destined for a profile which has already consumed its maximum number of buffers, or if the total number of buffers allowed has been consumed, that packet will wait until buffers have been emptied (e.g., such as by means of data being sent) such that the constraints on buffer utilization allow a new buffer to be allocated for it. All other packets in the QoS queues will wait behind the highest priority one. Because no new traffic is coming into the codeword builder, the traffic currently inside it will drain as it gets transmitted and once there is space in the target profile buffer, the highest priority packet will move from the QoS queues into it and traffic will proceed from there. This system ensures that the choice of profiles by the codeword builder matches the demand for profiles by the QoS engine.

In different examples, there are various ways to determine the limits on the number or size of the buffers per profile and on the total codeword builder buffering. This may be made by estimating the time it will take to send whatever data is allowed into the codeword builder, and then set a limit in terms of total allowed time. For instance, if a 1500-byte packet takes 100 μsec to send on Profile A, 50 μsec to send on Profile B, and 25 μsec to send on Profile C, and the latency target for each profile is 200 μsec, an implementation could limit the amount of data allowed into the codeword builder to a total of 200 μsec. At a given moment, the buffers might hold one 1500-byte packet for Profile A, one for Profile B, and one for Profile C, totaling 175 μsec. In this case, if the next packet from the QoS engine were a 1500-byte packet for Profile C, it could be allowed to enter the codeword builder, bringing the total to 200 μsec; however, if it were a 1500-byte packet for Profile A, only ¼ of the packet could be brought into the codeword builder buffers. Once more space became available, the rest of that packet would have to be brought in before any other packets were allowed to enter.

While the above method works, it may be overly complicated for some applications. For example, time estimates maybe imperfect since they may depend on exactly which sub-carriers get used, something which cannot be predicted in advance. The example shown in the FIG. 6B takes a much simpler approach which simulation shows still gives excellent results. In some examples, the codeword builder includes a limited number of buffers (e.g., configurable up to 32), and each buffer may be implemented to hold exactly one full codeword (14400 bits).

In the example 602 illustrated with respect to FIG. 6B, the buffers are labelled "2 k" because in this example, 2 kB of RAM is allocated per buffer since this is convenient for hardware. Additional logic may be implemented to prevent more than 14,400 bits per buffer from being used, so the effective buffer size is exactly the size of a codeword. Up to 2 buffers can be allocated per profile. The total number of buffers need not be exactly 2×number of profiles, but it may instead be configured so as to hold a total amount of traffic that is low enough to meet latency targets. Note that buffers may be allocated to profiles based on demand from the QoS engine. For example, if the QoS engine says that the next packet is for profile C, a buffer is allocated to profile C if any buffers are available. If no buffer space is available as described above, the packet waits until space is available (e.g., after packets are sent).

Note also that the fact that sometimes packets must wait in QoS queues before they can enter the codeword builder serves as "back pressure" on the QoS engine to help it match its rate to that of the downstream channel. As mentioned above, the instantaneous rate of the downstream channel varies depending on which profiles are in use at a particular moment. It will also be affected by codeword shortening, instantaneous variations in which sub-carriers gets used for which profile, and other artifacts of codeword builder decisions. The QoS engine can attempt to approximate this (e.g., if it knows that, on average, Profile B is twice as fast as Profile A). The QoS engine can estimate the instantaneous downstream rate based on the profiles of the packets it has chosen based on feedback from the codeword scheduler in order to create a closed loop system that gives a good rate match (or match to the desired target utilization). This referenced "back pressure" from full buffers in the codeword builder provides an indication that the QoS engine's estimate is slightly too high, so it can adjust to compensate.

Note that when a new buffer is assigned to hold a packet entering the codeword builder, it receives a timestamp indicating the time of entry. This timestamp is used to monitor the age of packets in the buffer (e.g., used to determine how long that packet is temporarily stored in a buffer). Note that the current time minus the packet's timestamp gives the latency that packet has experienced so far while waiting in the buffer. Other packets that may enter the buffer after the first one will become part of the same codeword and will experience lower latency. In general, the codeword builder scheduler block will look for buffers containing packets which have experienced the longest latency (e.g., oldest packets that have been temporarily stored the longest among the packets) and try to send codewords using these profiles first to service those oldest packets. There may be other, newer packets in the same profile buffer, and such packets may also be sent in the same codeword in order to fill the codeword. A partial packet may also be sent to fill a codeword. In this case, the remainder of the packet will retain the same timestamp as the original packet. Note that latency measurements are based on complete packets and so the remainder continues to age until it is sent.

Note that this particular example implements priority profiles by checking them first to see if they have traffic to send, and if so, checking the age (latency) of packets temporarily stored in these profile buffers. However, if priority profiles are always serviced strictly ahead of non-priority profiles, the non-priority profiles or lower priority profiles could be starved and their latency limits exceeded (e.g., every new arrival of a packet on a priority profile would prevent anything from being sent on the non-priority profile).

A processor operates using a threshold parameter (e.g., a predetermined period of time, a programmable threshold period of time, etc.) to serve as a minimum wait time for priority profiles only. In some examples, the threshold parameter will generally be much less than the target delay, but at least slightly longer than one OFDM symbol. Packets on priority profiles will wait at least "threshold" amount of time to allow non-priority profiles to be serviced, oldest packets first. If there is no traffic on non-priority profiles, the priority profile traffic will be sent right away.

Once a profile buffer is selected such as described above (e.g., based on priority, latency of packets buffered for the profile, and threshold (for priority profiles only), the processor executes codeword builder functionality to generate an information block using whatever data is present in the selected buffer. A full information block is constructed if the profile buffer is full at the moment the data is requested from the buffer; otherwise, a an information block is used based on whatever packets are included in the buffer at the moment the data is requested from the buffer.

With this approach, when the system is lightly loaded, profile buffers often will not be full and shortened codewords will be created very frequently. The lightly loaded system will tend not to wait at all for more traffic to fill a codeword. Generally, the system will only wait when it is forced to because the channel is full. The reduced efficiency of shortened codewords does not hurt the system in this case, because the total load is still less than the system capacity with codeword shortening. As load increases, however, the inefficiency of codeword shortening causes buffers in the codeword builder to become more full, causing longer codewords to be created, which in turn increases efficiency. In short, the efficiency of the system increases in conjunction with offered load, so that there is always enough efficiency to meet demand within the desired latency targets, until the offered load begins to exceed maximum channel capacity. Thus, the system automatically adjusts efficiency as needed to meet demand.

Figure 7:
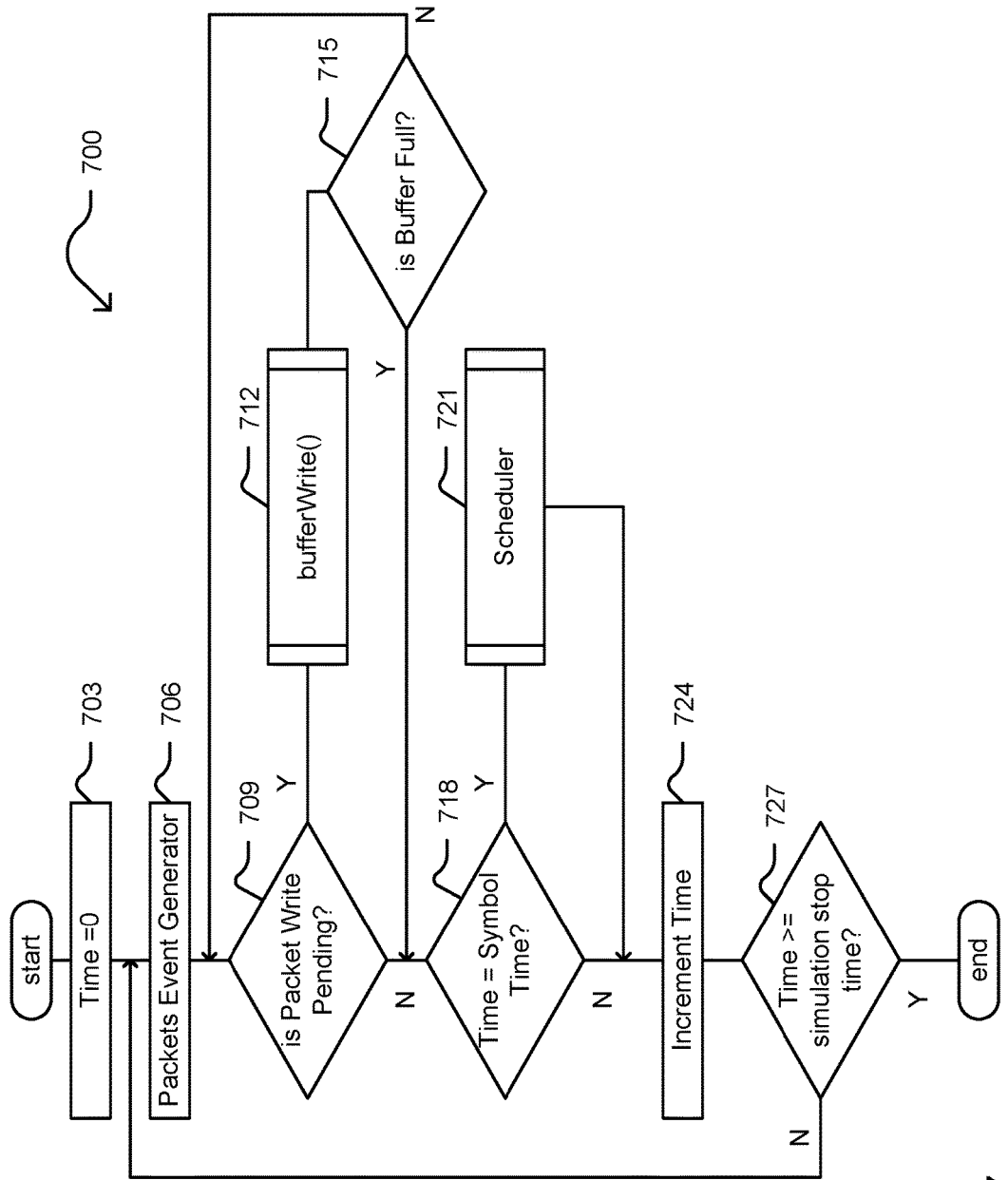
FIG. 7 is a diagram illustrating another embodiment of a method for execution by one or more communication devices.

FIG. 7 is a diagram illustrating another embodiment of a method 700 for execution by one or more communication devices. The method 700 may be viewed as showing a flow of the simulation event loop. A timer is started (block 703) (Time=0) and a packets even generator is triggered (block 706). If a packet write is not pending (block 709), the method 700 determines whether the time is same as the symbol time (block 718). If a packet write is pending (block 709), the method 700 performs a buffer write (block 712) and then determines if the buffer is full (block 715) and continues to (block 718) if it is or loops back to (block 709) if it is not.

If the time is same as the symbol time (block 718), the method 700 executes operations associated with a schedule (block 721, e.g., such as with respect to FIG. 9) and then increments time (block 724). If the time is not same as the symbol time (block 718), the method 700 increments time (block 724). The method 700 ends if the time is greater than or equal to the simulation stop time (block 727) or loops back to (block 706) it is it not.

Figure 8:
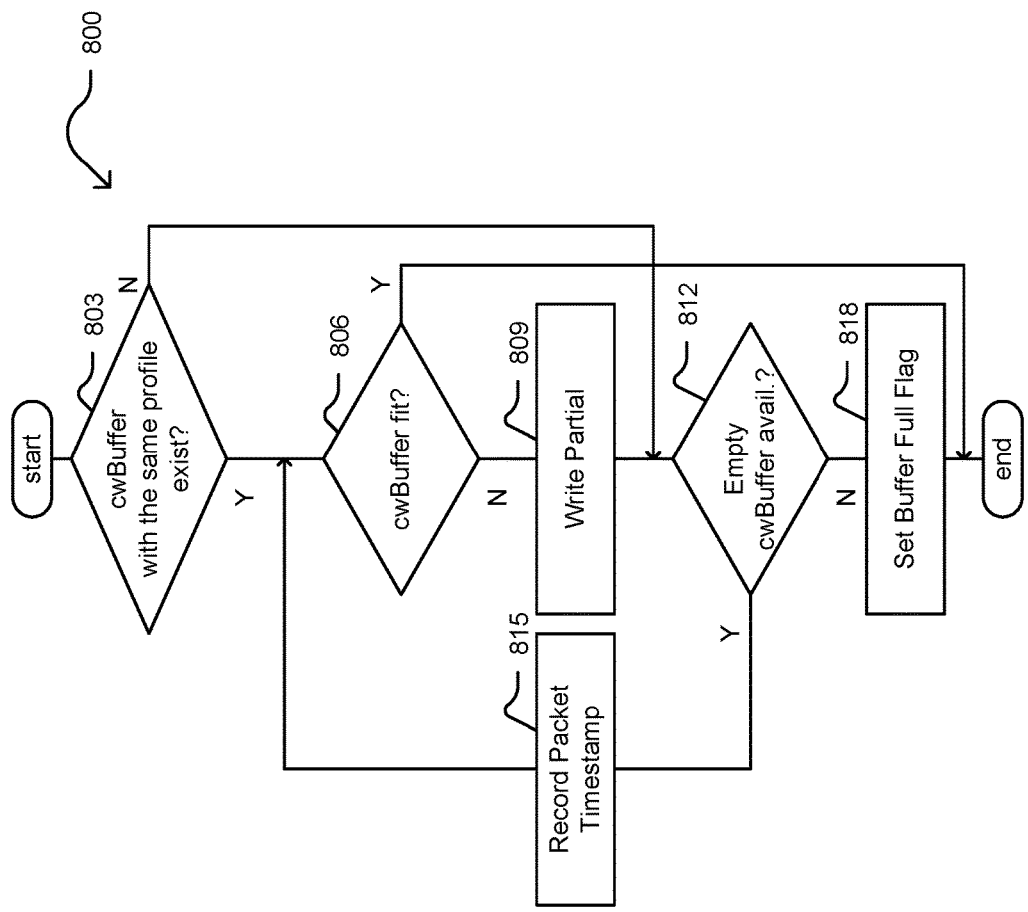
FIG. 8 is a diagram illustrating another embodiment of a method for execution by one or more communication devices.

FIG. 8 is a diagram illustrating another embodiment of a method 800 for execution by one or more communication devices. The method 800 may be viewed as showing a buffer allocation scheme implemented by a buffer manager (BUM). The method 800 determines if a codeword buffer (cwBuffer) with the same profile exists (block 803). If no codeword buffer (cwBuffer) with the same profile exists (block 803), the method 800 proceeds to (block 812).

If a codeword buffer (cwBuffer) with the same profile exists (block 803), the method 800 determines if there is a codeword buffer (cwBuffer) fit (block 806). If there is a codeword buffer (cwBuffer) fit (block 806), the method 800 ends. Alternatively, if there is no codeword buffer (cwBuffer) fit (block 806), a write partial operation is performed (block 809), and the method 800 proceeds to (block 812).

The method 800 determines if an empty codeword buffer (cwBuffer) is available (block 812). If no empty codeword buffer (cwBuffer) is available (block 812), the method 800 sets a buffer full flag (block 818) and ends. If an empty codeword buffer (cwBuffer) is available (block 812), the method 800 records packet timestamp (block 815) and loops to (block 806).

Figure 9:
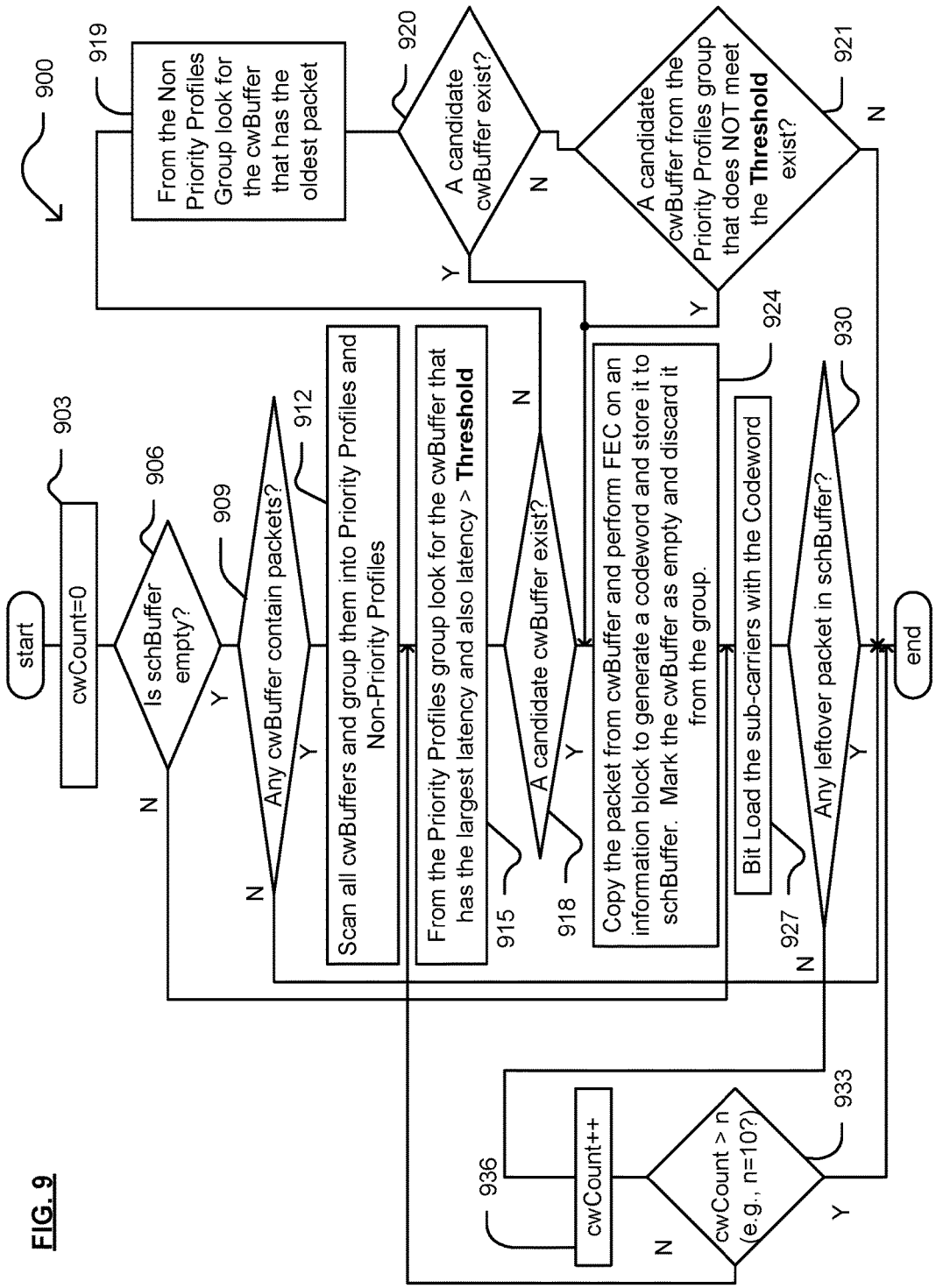
FIG. 9 is a diagram illustrating another embodiment of a method for execution by one or more communication devices.

FIG. 9 is a diagram illustrating another embodiment of a method 900 for execution by one or more communication devices. The method 900 may be viewed as showing operation of a scheduler including how to handle priority profiles and the use of a threshold (e.g., predetermined period of time, a programmable threshold, etc.).

A codeword count (cwCount) is set initialized (set to 0) (block 903). The method 900 determines if a scheduler buffer (schBuffer) is empty (block 906), proceeds to (block 927) if none is, and determines if any codeword buffer (cwBuffer) contains packets (block 909) if at least one is.

If no codeword buffer (cwBuffer) contains packets (block 909), then the method 900 ends. Alternatively, if a codeword buffer (cwBuffer) contains packets (block 909), the method 900 scans codeword buffers (cwBuffers) and groups them into priority profiles and non-priority profiles (block 912). Then, from the priority profiles group, the method 900 looks for the codeword buffer (cwBuffer) that has the largest latency (e.g., includes at least one packet that has been stored longer than a predetermined period of time) and also has a latency greater than a predetermined period of time (e.g., a programmable threshold) (block 915).

The method 900 then determines if a candidate codeword buffer (cwBuffer) exists (block 918). If a candidate codeword buffer (cwBuffer) exists (block 918), the method 900 copies the packet from the codeword buffer (cwBuffer) and performs forward error correction (FEC) on the information block to create a codeword and stores it to schedule buffer (schBuffer). The method 900 also marks the codeword buffer (cwBuffer) as empty and discards it from the group (block 924). The method 900 then bit loads the sub-carriers with the codeword (block 927). The method 900 then determines if there is any leftover packet in the schedule buffer (schBuffer) (block 930), and the method 900 ends if there is.

If there is not any leftover packet in the schedule buffer (schBuffer) (block 930), the method 900 increments the codeword count (cwCount) (block 936) and determines if the codeword count (cwCount) is greater than some programmable number n (e.g., n>10) (block 933), and the method 900 ends if it is and loops to (block 915) if it is not.

Referring back to (block 918), if no candidate codeword buffer (cwBuffer) exists (block 918), the method 900 look for the codeword buffer (cwBuffer) that has the oldest packet among the non-priority profiles Group (block 919) and determines if a candidate codeword buffer (cwBuffer) exists (block 920). If a candidate codeword buffer (cwBuffer) exists (block 920), the method 900 loops to (block 924). Alternatively, if no candidate codeword buffer (cwBuffer) exists (block 920), the method 900 determines if a candidate codeword buffer (cwBuffer) from the priority profiles groups exists that does not meet the threshold (block 921)), and the method 900 ends if none does and loops to (block 924) if one does.

In combination, the diagrams of FIG. 7, FIG. 8, and FIG. 9 give details showing the flow of a simulation of a codeword builder as described herein.

In general, FIG. 7 shows the flow of the simulation event loop. The "packet event generator" simulates packets being made available by the QoS engine. This can happen at any time. The Scheduler, which actually makes decisions about constructing codewords, is called once per OFDM symbol time; its job is to fill an OFDM symbol with codewords. In general, FIG. 8 shows the details of the buffer allocation scheme implemented by the buffer manager (BUM). The decision box "Empty cwBuffer avail.?" reflects the constraints that have been placed on number of buffers per profile and in total, as described above. In general, FIG. 9 shows the details of the scheduler, including how it handles priority profiles and use of the threshold.

A final function of the codeword builder occurs in the case where all data has been sent and the buffers are empty. In this case, there are empty sub-carriers and the scheduler has the option of either filling these sub-carriers with a "dummy codeword" containing "stuff bytes," or declaring them "zero bit loaded" and sending no information on these sub-carriers (e.g., which may include any desired valued bits, such as 0-valued bits, 1-valued bits, any desired bit sequence, dummy bits, fill bits, etc. but that include no actual information). The advantage of using a dummy codeword is that this codeword would use only part of the remaining sub-carriers. Then, if more data arrives before the symbol is complete, the rest of the sub-carriers could be used for that data. The scheduler estimates the amount of capacity left in the symbol and then attempts to predict whether any advantage can be gained by using a dummy codeword; if it predicts that this would not be useful, it declares the rest of the symbol to be "zero bit loaded."

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to," "operably coupled to," "coupled to," and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to," "operable to," "coupled to," or "operably coupled to" indicates that an item includes one or more of power connections, input(s), output(s), etc., to perform, when activated, one or more its corresponding functions and may further include inferred coupling to one or more other items. As may still further be used herein, the term "associated with," includes direct and/or indirect coupling of separate items and/or one item being embedded within another item.

As may be used herein, the term "compares favorably" or equivalent, indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module," "processing circuit," "processor," and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments of an invention have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The one or more embodiments are used herein to illustrate one or more aspects, one or more features, one or more concepts, and/or one or more examples of the invention. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module includes a processing module, a processor, a functional block, hardware, and/or memory that stores operational instructions for performing one or more functions as may be described herein. Note that, if the module is implemented via hardware, the hardware may operate independently and/or in conjunction with software and/or firmware. As also used herein, a module may contain one or more sub-modules, each of which may be one or more modules.

While particular combinations of various functions and features of the one or more embodiments have been expressly described herein, other combinations of these features and functions are likewise possible. The present disclosure of an invention is not limited by the particular examples disclosed herein and expressly incorporates these other combinations.

What is claimed is:

1. A communication device comprising:
   memory that includes a plurality of buffers configured to store temporarily respective subsets of packets containing information that are received via a packet stream and intended for transmission to one or more other communication devices via one or more communication channels coupling the communication device and one or more other communication devices, wherein each buffer of the plurality of buffers has a respective associated priority profile and corresponds to a respective portion of the memory;
   processing circuitry configured to:
      process at least one of a first plurality of packets or a first partial packet included within a first buffer among the plurality of buffers that has a first priority profile to determine whether any packet has been stored temporarily in the first buffer longer than a predetermined period of time that is based on a latency constraint for transmission of the information to the one or more other communication devices via the one or more communication channels;
      based on determination that at least one of at least one packet or at least one partial packet has been stored temporarily in the first buffer longer than the predetermined period of time, generate and output a first information block that includes the at least one of the first plurality of packets or the first partial packet included within the first buffer; and
      based on determination that no packet has been stored temporarily longer in the first buffer longer than the predetermined period of time, first generate and output a second information block that includes at least one of a second plurality of packets or a second partial packet included within a second buffer among the plurality of buffers that has a second priority profile that is lower than the first priority profile and second, process a remaining plurality of packets stored temporarily within a remaining plurality of buffers that excludes the first buffer to identify another buffer in which another packet has been stored temporarily longer than any other packet of the remaining plurality of packets stored temporarily within the remaining plurality of buffers and generate and output another information block that includes at least one of another plurality of packets or another partial packet included within the another buffer;

an encoder configured to encode at least one of the first information block, the second information block or the another information block to generate at least one encoded signal for transmission of the first information block, second information block or another information block to the one or more other communication devices via the one or more communication channels based on the latency constraint; and a communication interface configured to transmit the at least one encoded signal to the one or more other communication devices via the one or more communication channels based on the latency constraint.

2. The communication device of claim 1, wherein, based on the determination that no packet has been stored temporarily longer in the first buffer longer than the predetermined period of time, the processing circuitry is further configured to:

firstly generate and output the second information block that includes the at least one of the second plurality of packets or the second partial packet included within the second buffer among the plurality of buffers that has the second priority profile that is lower than the first priority profile; and secondly generate and output the first information block that includes the at least one of the first plurality of packets or the first partial packet included within the first buffer.

3. The communication device of claim 1, wherein at least one of:

the at least one of the first plurality of packets or the first partial packet included within the first buffer occupies less than a first storage capacity of the first buffer;

the at least one of the second plurality of packets or the second partial packet included within the second buffer occupies less than a second storage capacity of the second buffer, or the at least one of the another plurality of packets or the another partial packet included within the another buffer occupies less than another storage capacity of the another buffer.

4. The communication device of claim 1 further comprising:

the encoder configured to:
encode the first information block to generate a first encoded signal;
encode the second information block to generate a second encoded signal; and
encode the another information block to generate another encoded signal;

the communication interface configured to:
transmit the first encoded signal to a first at least one communication device of the one or more other communication devices using a first profile that includes first operational parameters that are selected based on a first at least one communication pathway between the communication device and the first at least one communication device;
transmit the second encoded signal to a second at least one communication device of the one or more other communication devices using a second profile that includes second operational parameters that are selected based on a second at least one communication pathway between the communication device and the second at least one communication device; and
transmit the another encoded signal to another at least one communication device of the one or more other communication devices using another profile that includes another operational parameters that are selected based on another at least one communication pathway between the communication device and the another at least one communication device.

5. The communication device of claim 4, wherein:

the first profile specifies a first at least one corresponding modulation for a first plurality of sub-carriers of a first at least one orthogonal frequency division multiplexing (OFDM) channel;

the second profile specifies a second at least one corresponding modulation for a second plurality of sub-carriers of a second at least one OFDM channel; and the another profile specifies another at least one corresponding modulation for another plurality of sub-carriers of another at least one orthogonal frequency division multiplexing (OFDM) channel.

6. The communication device of claim 1 further comprising:

a cable headend transmitter or a cable modem termination system (CMTS), and wherein the one or more other communication devices includes a cable modem.

7. The communication device of claim 1, wherein the communication device is further configured to support point-to-multipoint communications with a plurality of other communication devices within at least one of a satellite communication system, a wireless communication system, a wired communication system, a fiber-optic communication system, or a mobile communication system.

8. A communication device comprising:

memory that includes a plurality of buffers configured to store temporarily respective subsets of packets containing information that are received via a packet stream and intended for transmission to one or more other communication devices via one or more communication channels coupling the communication device and one or more other communication devices, wherein each buffer of the plurality of buffers has a respective associated priority profile and corresponds to a respective portion of the memory;

a processing circuitry configured to:
process a first plurality of packets or a first partial packet included within a first buffer among the plurality of buffers that has a first priority profile to determine whether any packet has been stored temporarily in the first buffer longer than a predetermined period of time that is based on a latency constraint for transmission of the information to the one or more other communication devices via the one or more communication channels;

based on determination that at least one of at least one packet or at least one partial packet has been stored temporarily in the first buffer longer than the predetermined period of time, generate and output a first information block that includes the at least one of the first plurality of packets or the first partial packet included within the first buffer; and based on determination that no packet has been stored temporarily longer in the first buffer longer than the predetermined period of time, first generate and output a second information block that includes at least one of a second plurality of packets or a second partial packet included within a second buffer among the plurality of buffers that has a second priority profile that is lower than the first priority profile, and second, process a remaining plurality of packets stored temporarily within a remaining plurality of buffers that excludes the first buffer to identify another buffer in which another packet has been stored temporarily longer than any other packet of the remaining plurality of packets stored temporarily within the remaining plurality of buffers and generate and output another information block that includes at least one of another plurality of packets or another partial packet included within the another buffer;

wherein at least one of the at least one of the first plurality of packets or the first partial packet included within the first buffer occupies less than a first storage capacity of the first buffer, the at least one of the second plurality of packets or the second partial packet included within the second buffer occupies less than a second storage capacity of the second buffer, or at least one of the remaining plurality of packets or the another partial packet included within the another buffer occupies less than another storage capacity of the another buffer;

an encoder configured to:
encode the first information block to generate a first encoded signal;
encode the second information block to generate a second encoded signal; and
encode the another information block to generate another encoded signal; and a communication interface configured to:
transmit the first encoded signal to a first at least one communication device of the one or more other communication devices via the one or more communication channels; and
transmit the second encoded signal to a second at least one communication device of the one or more other communication devices via the one or more communication channels, and
transmit the another encoded signal to another at least one communication device of the one or more other communication devices via the one or more communication channels.

9. The communication device of claim 8, wherein, based on the determination that no packet has been stored temporarily longer in the first buffer longer than the predetermined period of time, the processing circuitry is further configured to:
firstly generate and output the second information block that includes the at least one of the second plurality of packets or the second partial packet included within the second buffer among the plurality of buffers that has the second priority profile that is lower than the first priority profile; and
secondly generate and output the first information block that includes the at least one of the first plurality of packets or the first partial packet included within the first buffer.

10. The communication device of claim 8, wherein the communication interface is further configured to:
transmit the first encoded signal using a first profile that specifies a first at least one corresponding modulation for a first plurality of sub-carriers of a first at least one orthogonal frequency division multiplexing (OFDM) channel; and transmit the second encoded signal using a second profile that specifies a second at least one corresponding modulation for a second plurality of sub-carriers of a second at least one OFDM channel; and
transmit the another encoded signal to another at least one communication device of the one or more other communication devices using another profile that includes another operational parameters that are selected based on another at least one communication pathway between the communication device and the another at least one communication device.

11. The communication device of claim 8 further comprising:
a cable headend transmitter or a cable modem termination system (CMTS), and wherein the one or more other communication devices includes a cable modem.

12. The communication device of claim 8, wherein the communication device is further configured to support point-to-multipoint communications with a plurality of other communication devices within at least one of a satellite communication system, a wireless communication system, a wired communication system, a fiber-optic communication system, or a mobile communication system.

13. A method for execution by a communication device, the method comprising:
within memory of the communication device that includes a plurality of buffers, temporarily storing respective subsets of packets received containing information that are via a packet stream and intended for transmission to one or more other communication devices via one or more communication channels coupling the communication device and one or more other communication devices, wherein each buffer of the plurality of buffers has a respective associated priority profile and corresponds to a respective portion of the memory of the communication device;

processing at least one of a first plurality of packets or a first partial packet included within a first buffer among the plurality of buffers that has a first priority profile to determine whether any packet has been stored temporarily in the first buffer longer than a predetermined period of time that is based on a latency constraint for transmission of the information to the one or more other communication devices via the one or more communication channels;

based on determination that at least one of at least one packet or at least one partial packet has been stored temporarily in the first buffer longer than the predetermined period of time, generate and output a first information block that includes the at least one of the first plurality of packets or the first partial packet included within the first buffer;

based on determination that no packet has been stored temporarily longer in the first buffer longer than the predetermined period of time, first generate and output a second information block that includes at least one of a second plurality of packets or a second partial packet included within a second buffer among the plurality of buffers that has a second priority profile that is lower than the first priority profile and second, process a remaining plurality of packets stored temporarily within a remaining plurality of buffers that excludes the first buffer to identify another buffer in which another packet has been stored temporarily longer than any other packet of the remaining plurality of packets stored temporarily within the remaining plurality of buffers and generate and output another information block that includes at least one of another plurality of packets or another partial packet included within the another buffer; and encoding at least one of the first information block, the second information block, or the another information block to generate at least one encoded signal for transmission of the first information block, second information block or another information block to the one or more other communication devices via the one or more communication channels based on the latency constraint; and via a communication interface of the communication device, transmitting the at least one encoded signal to the one or more other communication devices via the one or more communication channels based on the latency constraint.

14. The method of claim 13 further comprising, based on the determination that no packet has been stored temporarily longer in the first buffer longer than the predetermined period of time:

firstly generating and outputting the second information block that includes the at least one of the second plurality of packets or the second partial packet included within the second buffer among the plurality of buffers that has the second priority profile that is lower than the first priority profile; and secondly generating and outputting the first information block that includes the at least one of the first plurality of packets or the first partial packet included within the first buffer.

15. The method of claim 13, wherein at least one of:

the at least one of the first plurality of packets or the first partial packet included within the first buffer occupies less than a first storage capacity of the first buffer;

the at least one of the second plurality of packets or the second partial packet included within the second buffer occupies less than a second storage capacity of the second buffer, or the at least one of the another plurality of packets or the another partial packet included within the another buffer occupies less than another storage capacity of the another buffer.

16. The method of claim 13 further comprising:

encoding the first information block to generate a first encoded signal;

encoding the second information block to generate a second encoded signal; and encoding the another information block to generate another encoded signal;

via the communication interface of the communication device, transmitting the first encoded signal to a first at least one communication device of the one or more other communication devices using a first profile that includes first operational parameters that are selected based on a first at least one communication pathway between the communication device and the first at least one communication device;

via the communication interface of the communication device, transmitting the second encoded signal to a second at least one communication device of the one or more other communication devices using a second profile that includes second operational parameters that are selected based on a second at least one communication pathway between the communication device and the second at least one communication device; and via the communication interface of the communication device, transmitting the another encoded signal to another at least one communication device of the one or more other communication devices using another profile that includes another operational parameters that are selected based on another at least one communication pathway between the communication device and the another at least one communication device.

17. The method of claim 13, wherein the communication device includes a cable headend transmitter or a cable modem termination system (CMTS), and wherein the one or more other communication devices includes a cable modem.

18. The method of claim 13 further comprising:

operating the communication device to support point-to-multipoint communications with a plurality of other communication devices within at least one of a satellite communication system, a wireless communication system, a wired communication system, a fiber-optic communication system, or a mobile communication system.

* * * * *